(12) United States Patent
Albertsen et al.

(10) Patent No.: US 8,424,717 B2
(45) Date of Patent: Apr. 23, 2013

(54) EFFICIENT DELIVERY AND PLACEMENT SYSTEMS FOR SWITCH CONTACTS

(75) Inventors: Kevin N. Albertsen, Fort Collins, CO (US); Troy Diaz, Fort Collins, CO (US); Josh Lowery, Fort Collins, CO (US); Earl R. Tatman, Fort Collins, CO (US); Brett A. Tatman, Windsor, CO (US)

(73) Assignee: Snaptron, Inc., Loveland, CO (US)

( * ) Notice: Subject to any disclaimer, the term of this patent is extended or adjusted under 35 U.S.C. 154(b) by 1216 days.

(21) Appl. No.: 11/793,887

(22) PCT Filed: Feb. 22, 2005

(86) PCT No.: PCT/US2005/005873
§ 371 (c)(1),
(2), (4) Date: Jun. 21, 2007

(87) PCT Pub. No.: WO2006/071240
PCT Pub. Date: Jul. 6, 2006

(65) Prior Publication Data
US 2008/0187429 A1    Aug. 7, 2008

Related U.S. Application Data

(60) Provisional application No. 60/638,917, filed on Dec. 23, 2004.

(51) Int. Cl.
*H01L 21/677* (2006.01)
*B65H 3/00* (2006.01)
*B65G 59/00* (2006.01)

(52) U.S. Cl.
USPC ........... 221/265; 221/290; 221/196; 221/277; 221/294

(58) Field of Classification Search .......... 221/197–198, 221/303, 280, 290, 294, 265, 289, 292, 293, 221/311, 188–189, 196, 277
See application file for complete search history.

(56) References Cited

U.S. PATENT DOCUMENTS

| 1,126,194 A | 1/1915 | Graham |
| 3,795,344 A | 3/1974 | Falk et al. |

(Continued)

FOREIGN PATENT DOCUMENTS

| CA | 0970735 | 7/1975 |
| CA | 1156622 | 11/1983 |

(Continued)

OTHER PUBLICATIONS

"Assisting our Customers in Reducing Their End Product Costs Through Mechanization and Automation of Our Products," www.bowman-domes.com/automation.htm; Feb. 9, 2005; 7 pages.

(Continued)

*Primary Examiner* — Michael K Collins
(74) *Attorney, Agent, or Firm* — Santangelo Law Offices, P.C.

(57) ABSTRACT

Hand-held placement dispenser element (6) and automated dispenser elements (18) are provided for placement of items such as metal domes or the like onto a placement position (21), such as right-side-up or upside-down, perhaps by allowing only a single item or predetermined number of items to eject from a dispenser element at a time. A dispenser element may include a trigger (7) allowing for non-complication in use. A dispenser element could accept a cartridge (1), such as a slotted cartridge (3). A dispenser element and cartridge may be interchangeable. Once a cartridge is empty, it may be desirable to remove the empty cartridge and replace it with a full one.

110 Claims, 33 Drawing Sheets

U.S. PATENT DOCUMENTS

| | | | |
|---|---|---|---|
| 3,886,012 A | | 5/1975 | Slater |
| 3,960,191 A | * | 6/1976 | Murray .................. 81/57.37 |
| 3,998,238 A | * | 12/1976 | Nigro ...................... 221/279 |
| 4,033,030 A | | 7/1977 | Robinson et al. |
| 4,050,578 A | * | 9/1977 | Eckert ..................... 206/340 |
| 4,153,987 A | | 5/1979 | Boulanger |
| 4,314,117 A | | 2/1982 | Ditzig |
| 4,375,126 A | * | 3/1983 | Dull et al. .................. 29/740 |
| 4,502,499 A | * | 3/1985 | Behr ........................ 453/49 |
| 4,643,795 A | * | 2/1987 | Ericsson .................. 156/562 |
| 4,941,795 A | | 7/1990 | Elliott et al. |
| 5,056,684 A | | 10/1991 | Beach et al. |
| 5,184,752 A | * | 2/1993 | Zylka et al. ................... 221/1 |
| 5,328,052 A | | 7/1994 | Kizilos |
| 5,388,467 A | | 2/1995 | Jereb et al. |
| 5,388,724 A | | 2/1995 | Adams et al. |
| 5,451,285 A | | 9/1995 | Santo et al. |
| 5,577,633 A | * | 11/1996 | Jones .......................... 221/1 |
| 5,598,082 A | | 1/1997 | Gilpin et al. |
| 6,098,839 A | | 8/2000 | Hunnell |
| 6,133,536 A | | 10/2000 | Hunag et al. |
| 6,135,291 A | * | 10/2000 | Canella ..................... 209/573 |
| 6,331,225 B1 | * | 12/2001 | Sugiyama .................. 156/299 |
| 6,443,689 B1 | * | 9/2002 | Reggiani ................ 414/795.6 |
| 6,446,692 B1 | * | 9/2002 | Sugiyama .................. 156/561 |

FOREIGN PATENT DOCUMENTS

| | | |
|---|---|---|
| CA | 2010195 | 5/1991 |
| EP | 0 800 426 B1 | 11/1998 |
| EP | 0 825 913 B1 | 1/1999 |
| EP | 1048596 A2 | 11/2000 |
| WO | WO 96/20799 | 7/1996 |
| WO | WO 96/36457 | 11/1996 |
| WO | WO 00/68964 | 11/2000 |
| WO | WO 2006/071240 A1 | 7/2006 |

OTHER PUBLICATIONS

U.S. Appl. No. 60/638,917, filed Dec. 23, 2004 entitled "Efficient Switch Contact Delivery and Placement Systems".

US Provisional Application, filed Jun. 11, 2007, entitled "Methods and Apparatus for Performance and Endurance Testing of Switch Contact Systems".

U.S. Appl. No. 11/801,630, filed May 9, 2007, entitled "Electrical Switch Apparatus and Methods".

Search Report and Written Opinion for PCT/US2005/005873 dated Jul. 22, 2005.

Parallel Canada Patent Application No. 2592134, Office Action dated Apr. 6, 2011.

Parallel European Regional Patent Application No. 05714019.6, Supplemental Search Report dated May 25, 2012.

* cited by examiner

US 8,424,717 B2

EFFICIENT DELIVERY AND PLACEMENT SYSTEMS FOR SWITCH CONTACTS

This application is a U.S. National Stage of International Application No. PCT/2005/05873, filed Feb. 22, 2005, which claims the benefit of U.S. Provisional Application No. 60/638,917, filed Dec. 23, 2004, each hereby incorporated by reference herein.

BACKGROUND

The present invention relates to efficient delivery and placement systems of items such as switch contacts, domes, metal domes, force activated switches, snap-acting switches and the like. Specifically, the present invention focuses upon apparatus and methods for the automatic or perhaps even manual delivery and placement of metal domes and the like during manufacturing of electronics such as membrane switches, rotary switches, tact switches, keyboards, phones, printed circuit boards, and the like, and perhaps even manufacturing of non-electronic items.

A tactile metal dome switch may give a user a positive tactile feedback when depressed, and may even allow a user to know that a switch has made contact without the aid of visual confirmation. A typical snap acting switch, dome, or metal dome may have a moveable contact actuated between a closed position and a normally open position upon movement of a switch. Membrane switch industries and related electromechanical switch industries may have a use for domes and the like. A tactile metal dome may be used in a variety of applications including, but not limited to: mobile phone, pager, automotive, consumer electronics, appliance, membrane, keypads and the like. Tactile metal domes, tactile metal dome arrays and the like, may be momentary switch contacts that, when used in conjunction with a printed circuit board, flex circuit, membrane or the like, become normally-open tactile switches. Other uses may include complete switch assemblies, constant force domes, flat panels, and the like. It may be desirable to provide an efficient system for placement and manufacture of metal domes in such devices.

Metal domes may be placed on a printed circuit board, flex circuits, membranes and the like with the use of pressure-sensitive adhesive tape or perhaps even a system that picks up and drops off domes onto a surface. In their relaxed state, the metal domes may rest on the outer rim of a primary pathway. When pushed, domes may collapse and may make contact with a secondary pathway, thereby closing a circuit. In another example, individual domes may be backed with a square of polyester-adhesive. Each individual dome may then be peeled off of a release liner and may be placed onto a circuit board, flex circuit or membrane with the polyester-adhesive serving to hold a dome in place. Another example, as discussed in PCT publication no. WO 00/68964 to Nicomatic, includes a burn-in and testing of subassemblies of electrical devices such as subassemblies comprising an adhesive film and several keyboard elastic domes useful for making keyboards. Problems associated with pressure-sensitive adhesive tape, polyester-adhesive, systems for picking up and placement or the like may include additional assembly time and perhaps even additional costs.

SUMMARY OF THE INVENTION

The present invention includes a variety of aspects which may be selected in different combinations based upon the particular application or needs to be addressed. In a basic form, the invention discloses a cartridge, dispenser element and perhaps even an automated or manual dispenser system that may allow metal domes to be placed on a desired surface of a device in an efficient manner.

In embodiments, a hand-held placement pen, such as a dispenser element attached to a cartridge may place a dome or the like in a position, such as right-side-up or upside-down, perhaps by allowing only a single item to eject from a dispenser element at a time. A dispenser element could be ergonomically sound so that a user may feel comfortable using it. It may be desirable to provide a line-of-sight feature which may allow a user to see where they are placing an item, such as from a user's eyes to a dispenser element tip. In embodiments, a dispenser element could be small and light which may facilitate ease of use. A dispenser element, in other embodiments, may even include a spring return button actuation allowing for non-complication in use. A dispenser element could accept a cartridge, such as a slotted cartridge full of domes. An apparatus may make use of a slot in the side of a cartridge. A dispenser element and cartridge may be interchangeable. Once a cartridge may be empty, it may be desirable to remove the empty cartridge and replace it with a full one.

It is an object of the present invention to provide an accurate position placement of a plurality of metal domes in an affordable, highly efficient, and versatile item placement position.

It is another object of this invention to provide a cartridge in which metal domes may be stored.

It is an object of the present invention to provide a dispenser element that may receive at least one cartridge for dispensing metal domes.

It is yet another object of the present invention to provide an automated dispenser system in which the placement of multiple domes may be automated.

It is another object of the present invention to provide a dispenser element that can dispense domes manually.

It is yet another object of the present invention to move a plurality of metal domes such as in a cartridge to each placement position to dispense each metal dome one at a time onto the placement positions.

Still yet further objects of the invention will be apparent from this specification, including the drawings.

DETAILED DESCRIPTION OF THE PREFERRED EMBODIMENTS

As mentioned earlier, the present invention includes a variety of aspects, which may be combined in different ways. The following descriptions are provided to list elements and describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

In embodiments, the present invention may include efficient item delivery and placement systems. Items may include any kind of item such as but not limited to domes, force activated switches, snap-action switches, buttons, microchips, metal domes and the like. The present invention may provide, in embodiments, methods for distributing metal domes onto a surface and even a metal dome distribution apparatus. While, of course, other items may be distributed such as other tactile elements and the like, this disclosure uses metal domes and the like as examples. It is to be understood that the claim language may vary and may even include other distribution items, if desired.

Figure 1:
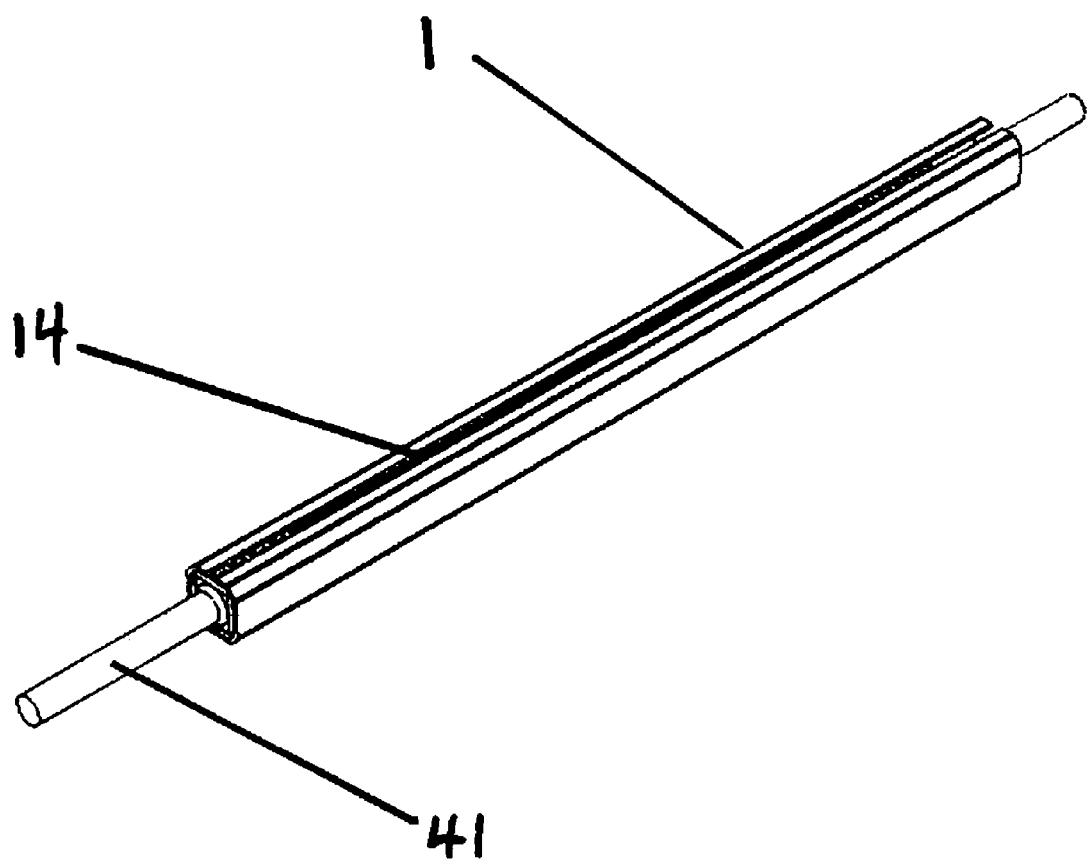
FIG. 1 is a side perspective view of an embodiment of the present invention of a cartridge containing domes.
Figure 3:
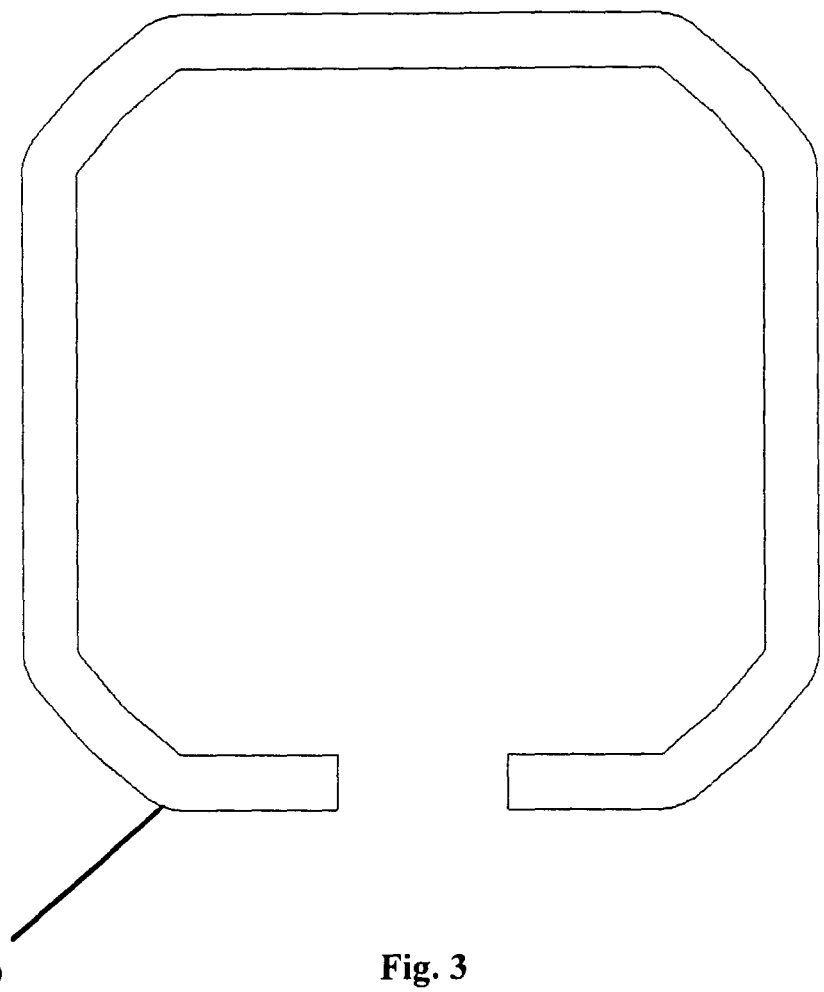
FIG. 3 is an embodiment of the present invention of a cross sectional view of a cartridge.
Figure 4:
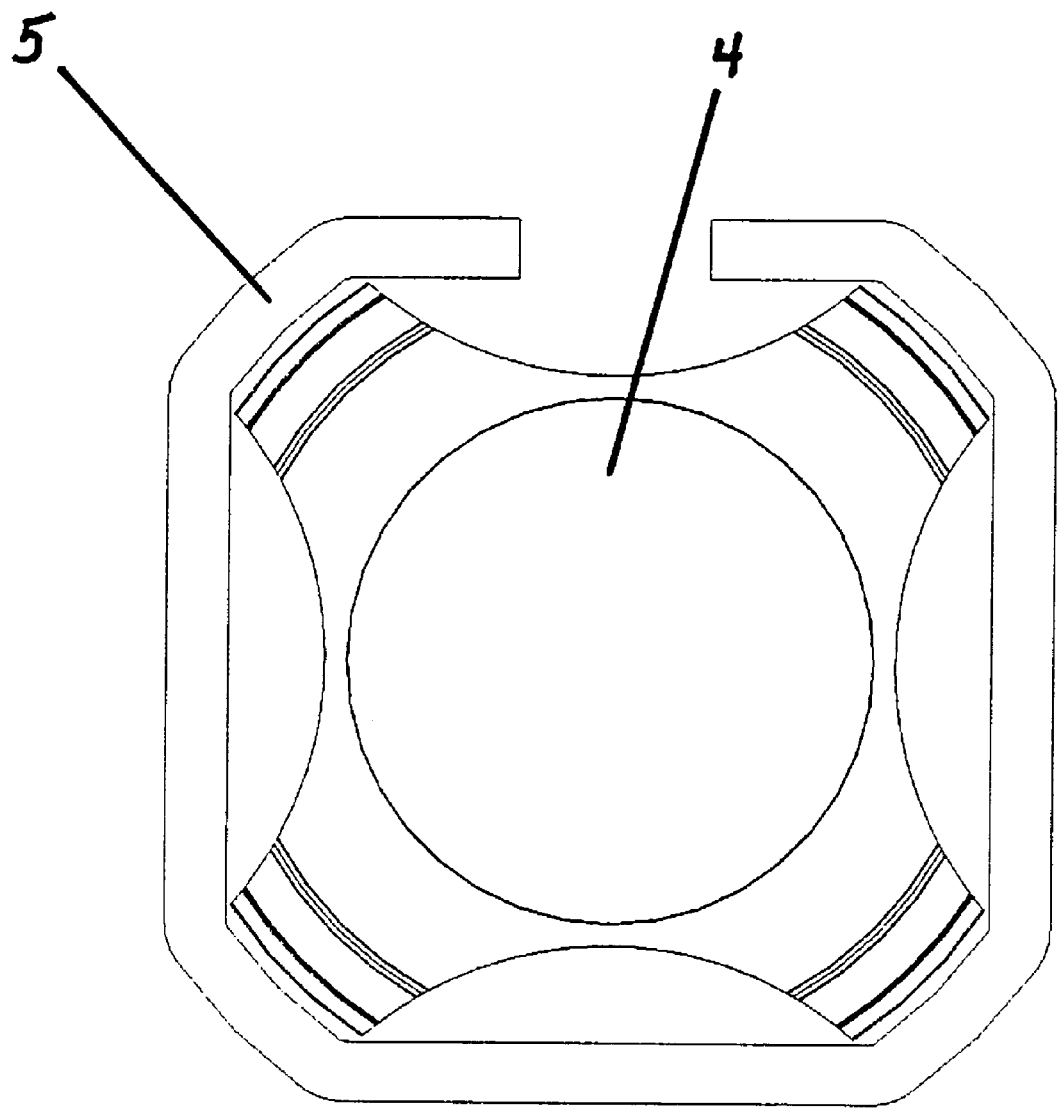
FIG. 4 is an embodiment of the present invention of a cross sectional view of a cartridge and a dome.

In embodiments, and as shown in FIG. 1, a cartridge (1) may provide a container for holding a plurality of metal domes (4), such as a stack of domes (14). A plurality of metal domes may be contained in a cartridge by frictional caps or even plugs (41) at each end. These may be removed prior to attachment to a dispenser system or apparatus. In embodiments, a cartridge (1) may include a slotted cartridge (3) and may even have a C shape (5) as shown in FIGS. 3 and 4. A dome may comfortably fit into a cartridge and a cartridge may contain and even hold a plurality of metal domes with restricted movement. The present invention may include, in embodiments, providing a cartridge having at least one dispenser end (2), such as but not limited to a dispenser end at each end of a cartridge. In embodiments, a cartridge could be designed with sufficiently close tolerances to allow it to be used to position domes. Of course, a cartridge may be any shape which may provide containment of an item or perhaps even positioning of an item such as a metal dome (4) while allowing such items to move along the inside of a cartridge. As can be seen in FIG. 4, a metal dome (4) may fit inside a C shaped cartridge (5) while allowing a small amount of space for vertical movement of the dome. A cartridge, in embodiments, may be a tube having a slot and may even be made of aluminum, plastic, or the like materials. An anodized coating, in embodiments, may improve movement of a plurality of metal domes and may even help a plurality of metal domes arranged in a stack stay together in the absence of end control.

In embodiments, the present invention may provide visually indicating an amount of metal domes in a cartridge. A slot or even a slotted cartridge may visually aid a user or even an automated machine to assist in determining a quantity of items or level of cartridge filling, such as metal domes, that may be present in the cartridge. When using a cartridge (1), such as with a dispenser element as may be described below, a user may be able to identify when a cartridge is getting low in the number of domes contained therein and may even be able to prepare for an exchange with a full cartridge. A slot may also allow a user or machine to determine an orientation of an item such as a dome so that they can be aware of the orientation of an item as it could be dispensed from a dispenser element. In other embodiments, it may be desirable to color code a cartridge or perhaps even items, such as domes and the like, to represent different sizes or shapes of the items. A slotted cartridge may even allow mechanical interface to an inside of a cartridge and to a plurality of domes such as in a dome stack (14).

Figure 2:
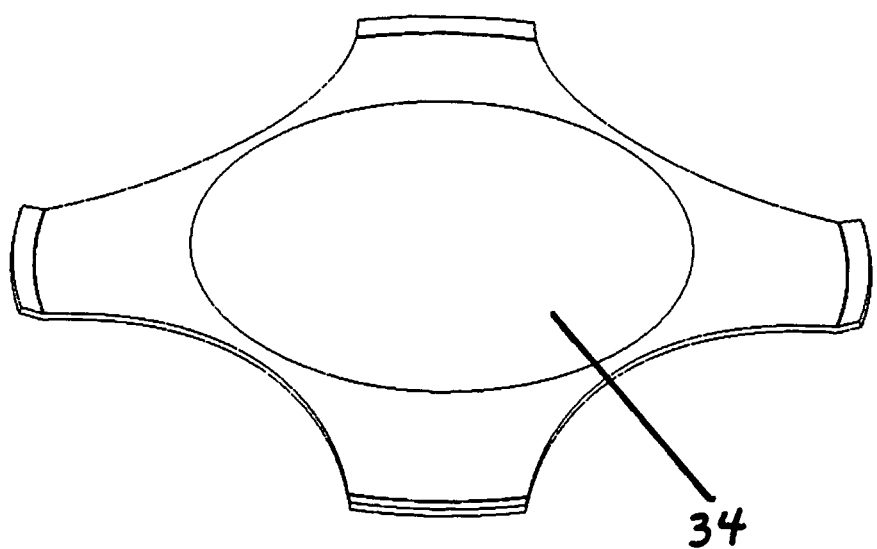
FIG. 2 is a side perspective view of a metal dome having feet according to embodiments of the present invention.

Items in a cartridge, such as metal domes, may be orientated in a particular fashion depending on the desired dispensed orientation. In embodiments, it may be desirable to arrange a plurality of metal domes into a position. When a plurality of metal domes may be placed into a cartridge, they may be arranged one on top of another into a dome stack (14). The metal domes may, in embodiments, be capable of having an upright position different from an upside down position. For example, since a dome may have a rounded shape and may even have curved edges, it may have two orientation positions. In embodiments, a metal dome (4) may be a footed metal dome (34) such as shown in FIG. 2 where a cartridge may hold a plurality of arranged footed metal domes. Of course, domes may include other structures that may allow them to be placed in an upright or upside down position, such as with projections, curvatures and the like. It is meant to be understood that all of these are to be included in this disclosure. Accordingly, depending on the manufacturing of the surface to which domes may be placed, domes could be arranged in a face up, face down or a combination of face up and face does positions. In embodiments, face up may include feet of a dome placed up. A plurality of metal domes, such as held within a cartridge, may be placed into a dispenser element so that the domes are positioned in an arrangement of face up, face down or a combination of these.

In embodiments, an orientation of a metal dome may be changed before it may be dispensed. For example, it may be desirable to change at least one metal dome, or perhaps even a plurality of metal domes prior to dispensing them with a dome orientation change element. An orientation change may be achieved manually or perhaps even automatically. Manual change of an orientation may include reversing a position of a cartridge in a dispenser element such as, but not limited to, by removing a dispenser end (2) of a cartridge from a dispenser element, and inserting an opposite dispenser end into a dispenser element. An automated orientation change of a metal dome may include a robotic feature to reverse a cartridge. An orientation change may even include turning a metal dome over by about 180 degrees. Alternatively, an orientation change may include a rotational change of a metal dome with a metal dome rotation element. For example, planar rotation of a metal dome may include a metal dome which may remain in an upright or even upside down position and rotating it, for example by about 30 degrees.

In embodiments, the present invention may provide locating a dispenser end (2) of cartridge and plurality of arranged metal domes above at least one metal dome placement position (21). A plurality of placement positions may be desired, above which a metal dome dispenser and plurality of arranged metal domes in a cartridge may be moveably located. A dispensing system may include moving a plurality of metal domes in a cartridge above a first placement position, dispensing a first metal dome, moving the cartridge to a second placement position, dispensing a second metal dome, etcetera. While any kind of surface may be used for distribution of an item, some examples of placement positions may include, but are not limited to, an electronic device surface, a non-electronic device surface, a printed circuit board, a circuit board, a flexible circuit, a membrane switch, a rotary switch, a tact switch, a keyboard, a keypad, polyester overlay, electroluminescence ("EL") lighting panel, shielding layers, any surface requiring tactile elements and the like.

The present invention may provide, in embodiments, releasing one metal dome from a dispenser end (2) of a cartridge onto at least one metal dome placement position. Releasing may include freeing a plurality of metal domes one at a time from a cartridge. In embodiments, a metal dome may be dropped from a cartridge onto a placement position, such as with a dispenser element as discussed herein. In other embodiments, the present invention may provide a metal dome dispenser capable of unidirectional dispensing of each of a plurality of arranged metal domes from a dispenser end of a cartridge onto a metal dome placement position. Unidirectionally dispensing may include operating, moving, or even facilitating movement of a metal dome from a plurality of metal domes in one direction as it may be dispensed from an end of a cartridge onto a placement position. A directional flow of a metal dome as it may be released and placed onto a placement position may be in substantially one direction, in embodiments. Yet, it is meant to be understood that, in embodiments, a rotation of a metal dome may occur during a dispensing process. This may still create an overall unidirectional movement of a metal dome as it moves from a cartridge to a placement position. Unidirectional movement may include, in embodiments, a downward directional movement and even downward dropping of each of a plurality of arranged metal domes onto a placement position. Accordingly, in embodiments, a metal dome dispenser may be capable of downward dropping of each of a plurality of arranged metal domes so as to provide downward dropping of a metal dome from a dispenser end of a cartridge to a placement position.

Figure 7:
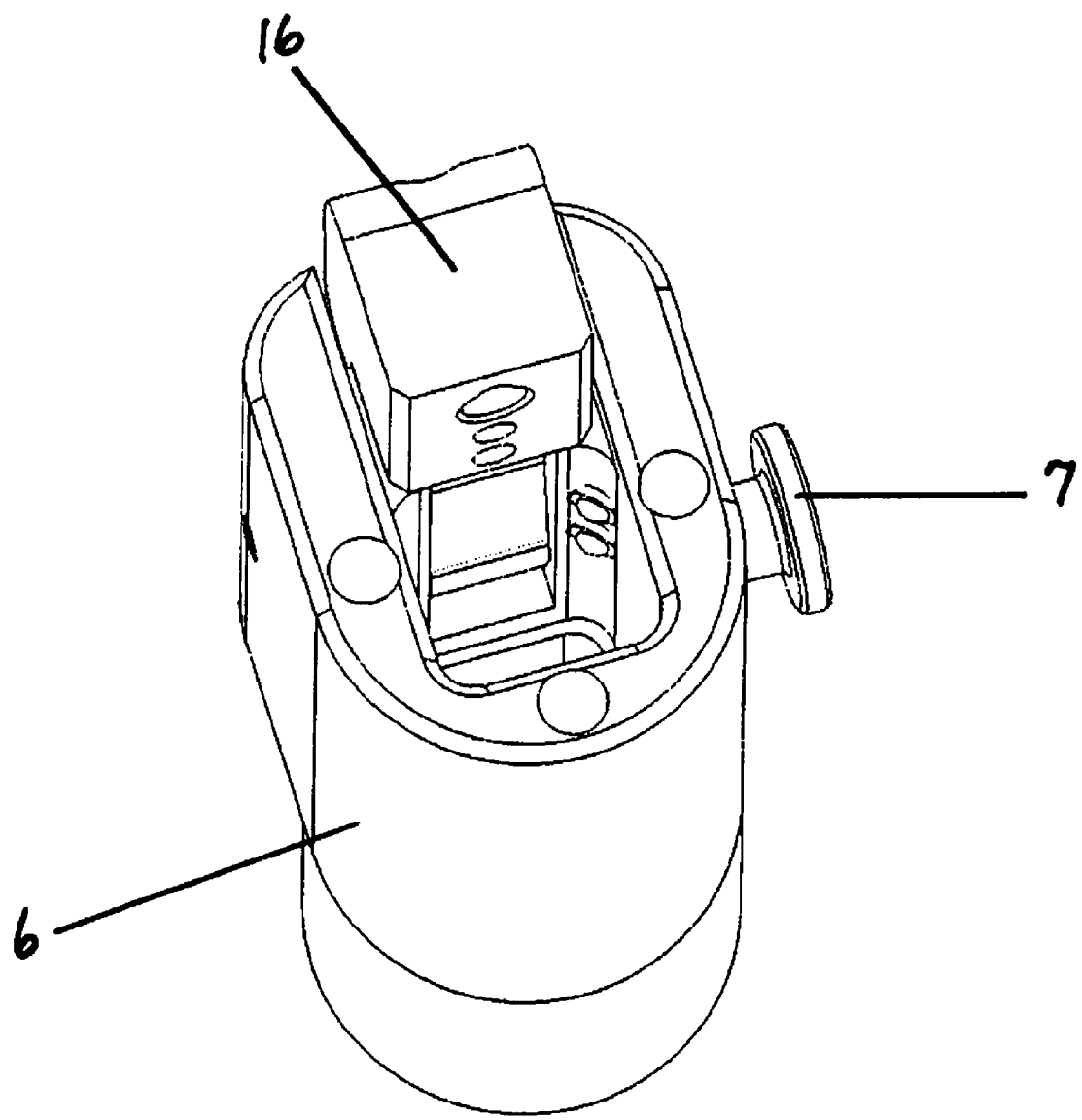
FIG. 7 is top a perspective view of a dispenser element in accordance with embodiments of the present invention.
Figure 8:
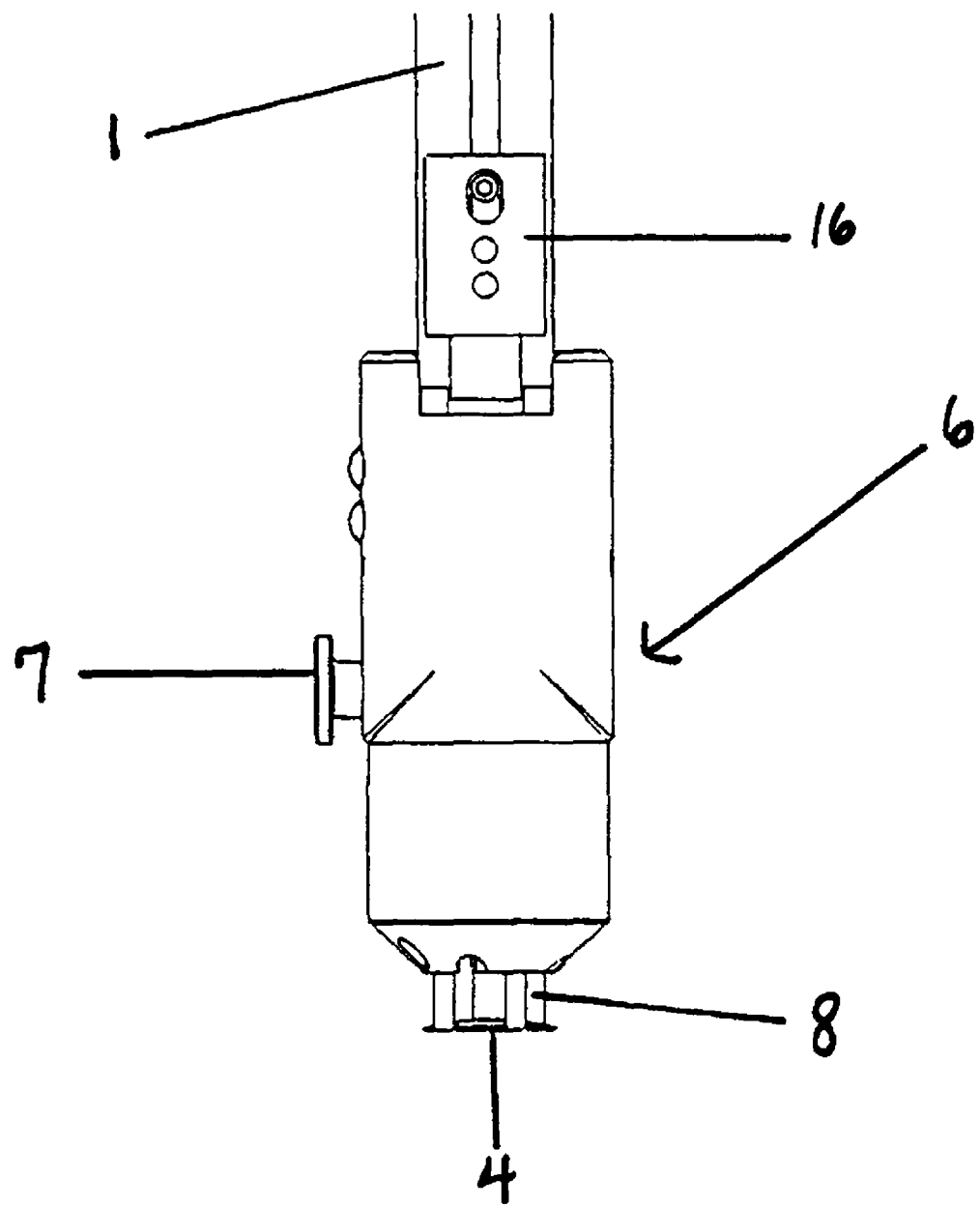
FIG. 8 is a partial front view of a dispenser element attached to a cartridge in accordance with an embodiment of the present invention.
Figure 9:
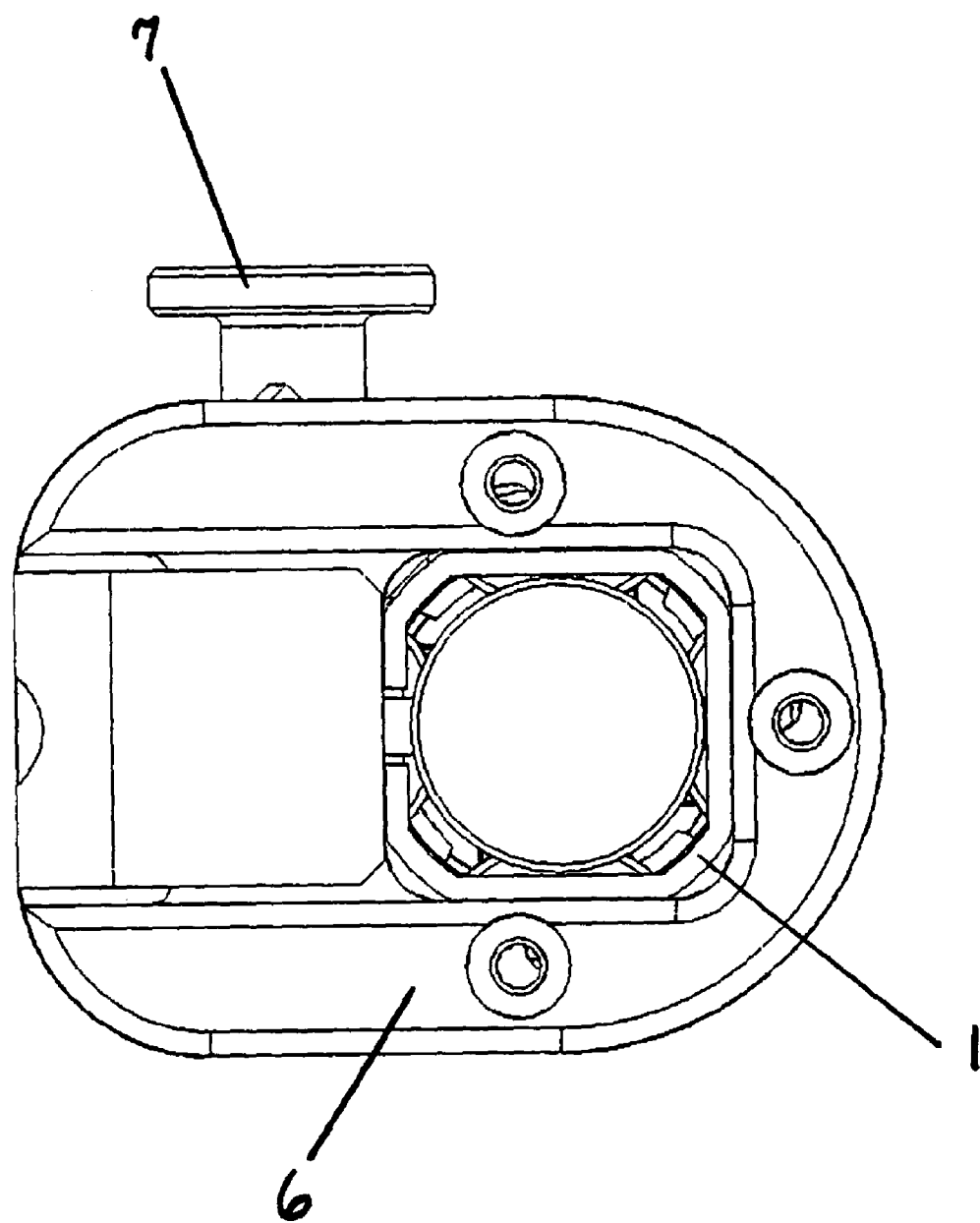
FIG. 9 is a top view of a dispenser element and cartridge in accordance with embodiments of the present invention.
Figure 10:
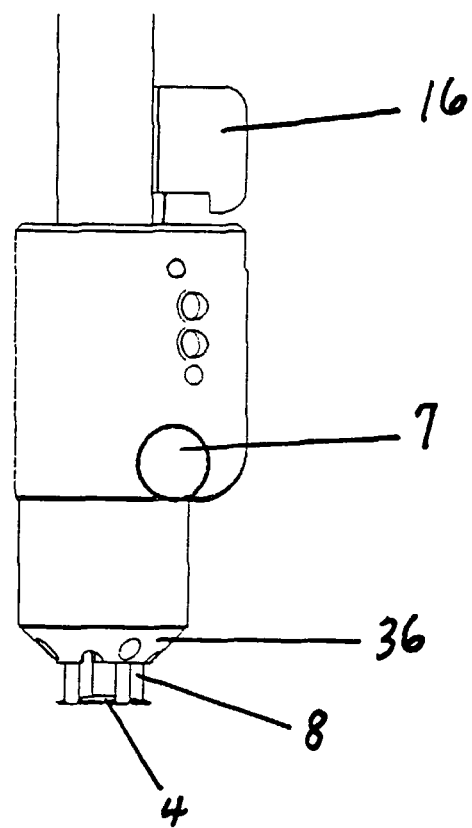
FIG. 10 is a partial side view of a dispenser element attached to a cartridge in accordance with embodiments of the present invention.

In embodiments and as can be seen in FIGS. 7 and 9, a metal dome dispenser (6) may be removably attached to a dispenser end of a cartridge and may even be capable of release of each of a plurality of arranged metal domes from a cartridge onto a metal dome placement position. The present invention may provide attaching a dispenser element to a dispenser end of a cartridge. A dispenser element may be removably interlocked or perhaps may even snap onto a dispenser end of a cartridge so that items, such as metal domes and the like, may be individually or perhaps even in predetermined multiples, dispensed from a dispenser element. Metal domes may be held within a cartridge by at least part of a dispenser element. This may allow movement and even placement of a cartridge above a metal dome placement position without premature dispensing of metal domes. For example, a plurality of metal domes may be held in a cartridge by at least one projection (12) of a dispenser element or perhaps even an automated dispenser element. A projection, perhaps even two, three, four or more projections may hold a plurality of metal domes, such as arranged in a dome stack at an end of a dome stack.

After each dome may be released, the present invention may provide moving a plurality of arranged metal domes towards a dispenser end of cartridge in preparation for a next dispensing step. A plurality of domes such as arranged in a dome stack in a cartridge may be moved towards a dispenser end by gravitational forces, manual forces, automated forces, a spring mechanism, a plunger and the like. As an example, certain embodiments of the present invention may provide a plunger (11) and perhaps even a spring mechanism (16).

Figure 5:
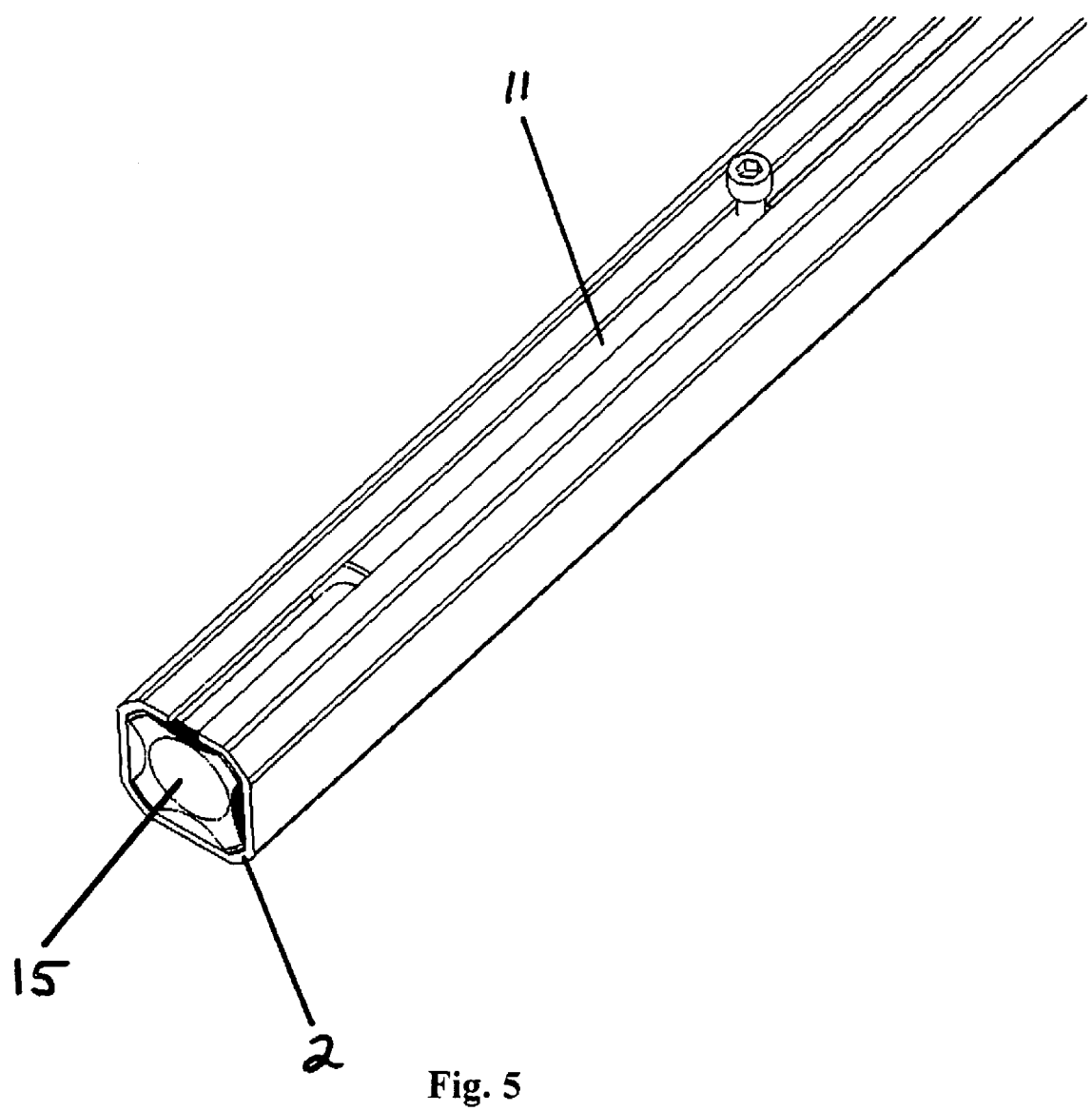
FIG. 5 is a partial view of an embodiment of the present invention of a cartridge, a last dome and a plunger in accordance with various embodiments of the present invention.
Figure 6:
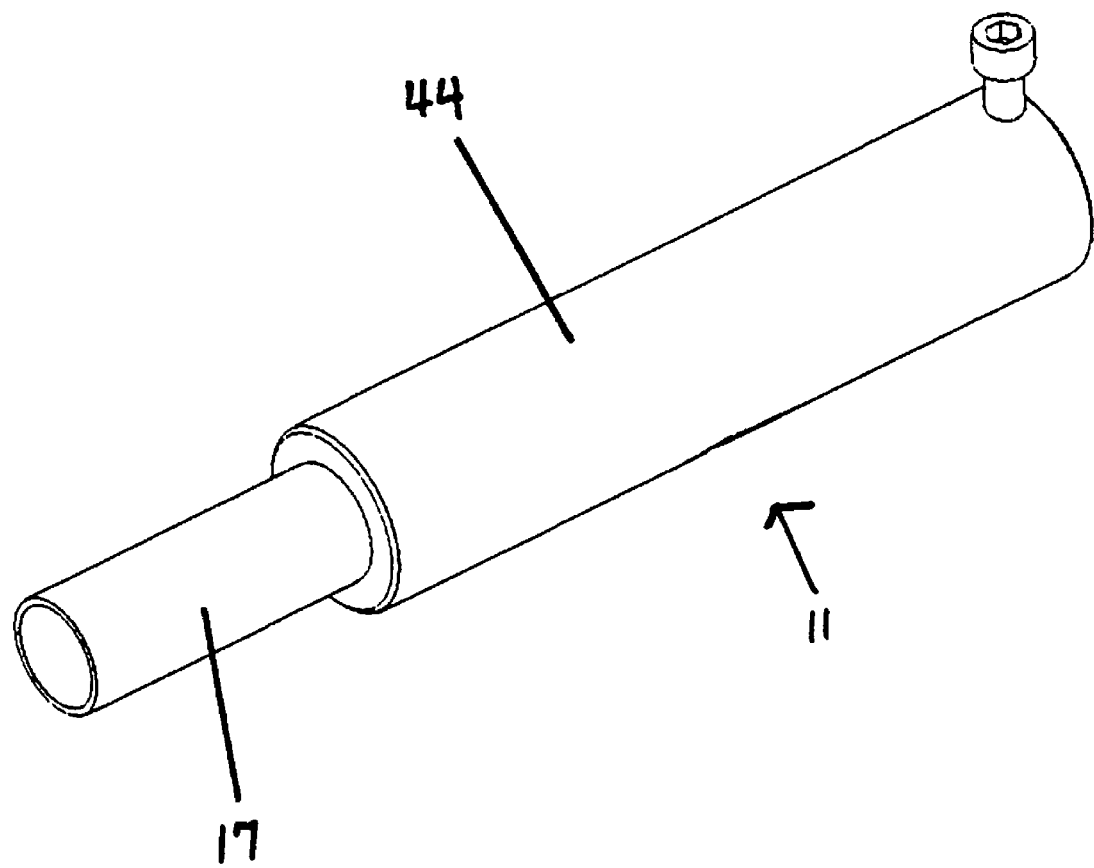
FIG. 6 is a side view of a plunger in accordance with embodiments of the present invention.

A plunger (11), as shown in FIGS. 5 and 6 may be removably located within a cartridge at an end of a dome stack, perhaps even above a dome stack and may move a plurality of domes towards a dispenser end. A plunger (11) may be gravitationally driven, manually driven, automation driven, or perhaps even responsive to a spring mechanism which may allow a stack of domes to be pushed down toward a dispenser element. A plunger may be designed to be slippery and may have a close fit to an inside of a cartridge. In embodiments, a plunger (11) may be long so as to slide smoothly through a cartridge even while loaded and unloaded. As each dome may be dispensed, a dome stack may decrease and a plunger and perhaps even a spring mechanism may move closer to a dispenser element and may even move at least partially through an inside of a dispenser element to push out even a final dome in a stack. In embodiments, a plunger may include, a lower piece (17) that may be narrow, such as more narrow than an upper piece (44), so that when it may engage with a tapered portion of a dispenser element it may fit. An end of a narrow piece of a plunger may even be profiled to match a dome shape to avoid damaging very light fragile domes.

A spring mechanism (16), as can be seen in FIGS. 8, 10, 23 and 24 may be removably attached to a plurality of domes, such as a dome stack. A spring mechanism may include, in embodiments, a spring and a latch (43). A spring mechanism (16) may be latched onto an upper end of a dome stack or even on a plunger, such as by an external spring hook and may create a constant force on a dome stack. A spring mechanism may apply force to a plurality of metal domes which may allow it to pull a stack of metal domes towards a dispenser element as domes may be dispensed. For example, once a dome may be dispensed, a spring may apply force to push a plurality of metal domes in a dome stack down and may allow a next dome to be in a proper placement for a next dispense action. A spring mechanism may allow a dispenser element and cartridge to be inverted without spilling and may even allow a dispenser element to be operated in any orientation relative to gravity. A spring may be a strip spring (42) where a curled metal piece, once partially stretched may pull itself back into an curled up position and may cause self-rotation due to its desire to wind up on a rotatable hub. At an end of a spring may be a deformation attached to a rotatable piece or even an internal screw. A spring mechanism could also be accomplished with a tension spring. Once a cartridge may be empty, a spring mechanism may not have any effect upon the dispenser element and cartridge.

Figure 15:
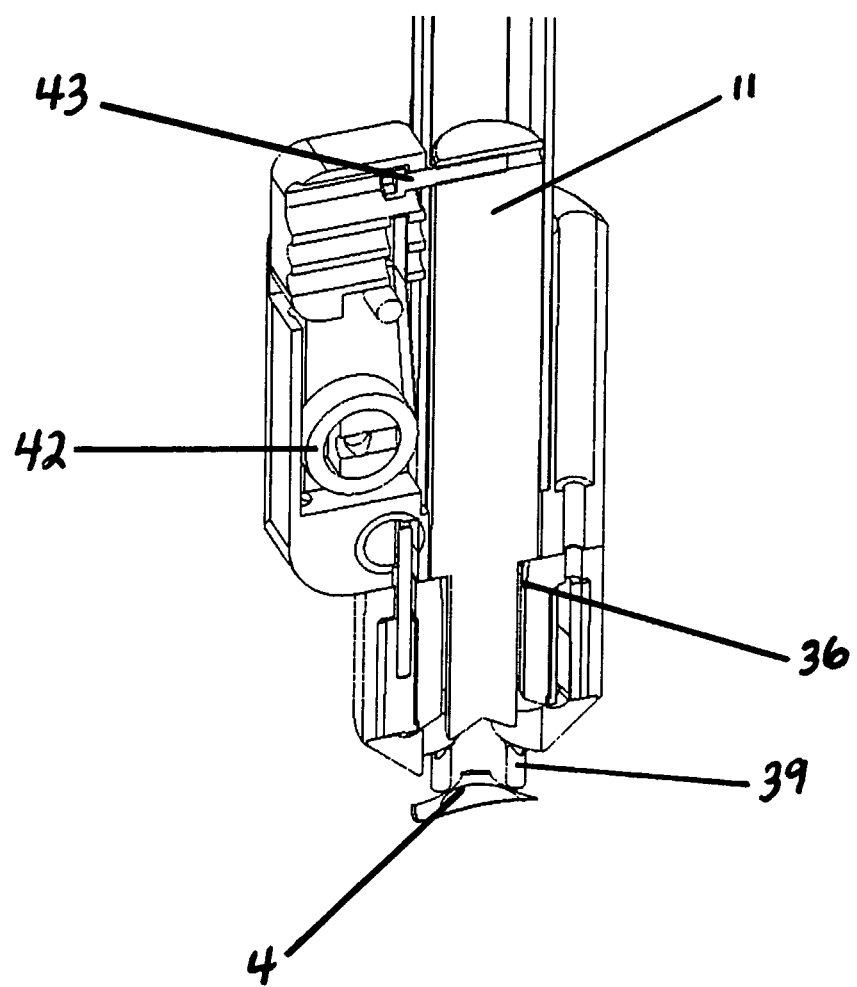
FIG. 15 is a cross sectional view of a dispenser element, plunger and cartridge in a position after a final metal dome has been dispensed from a cartridge in accordance with embodiments of the present invention.

Once a dispenser element may dispense its last metal dome in a cartridge, a plunger may slightly or perhaps even mostly drop into a dispenser element to give an indication that a cartridge may be empty. A drop may give an audible difference, such as a click, as the end of a plunger moves further into an end of a dispenser element, that the last dome has been dispensed. FIG. 15 shows a plunger positioned at an end of a dispenser element after a cartridge may be empty.

A replacement cartridge may be provided for use when a cartridge may be empty. In embodiments, the present invention may provide replacing a cartridge such as by manual replacement, automatic replacement and the like. When interchanging cartridges, in some embodiments, an empty cartridge may be removed by detaching a spring mechanism, removing a plunger and removing an empty cartridge from a dispenser element. A plunger may be inserted into a new, full cartridge, the cartridge may be turned over, inserted into a dispenser element and a detachable latch or even spring may be pulled up and hooked to a plunger with a latch. A cartridge and dispenser element may be assembled without turning it over perhaps if a plug may be designed to be pulled through a dispenser element.

Figure 11:
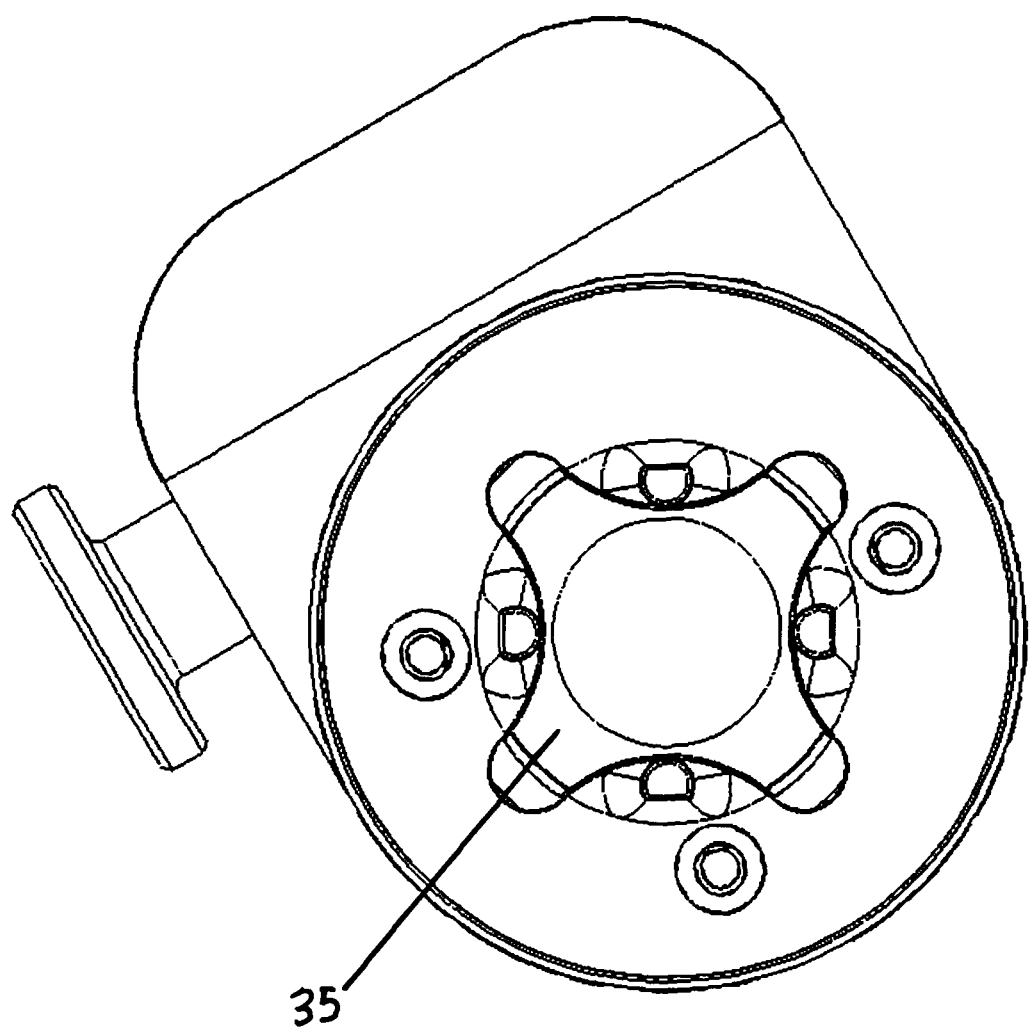
FIG. 11 is a bottom view of a dispenser element in accordance with embodiments of the present invention.
Figure 17:
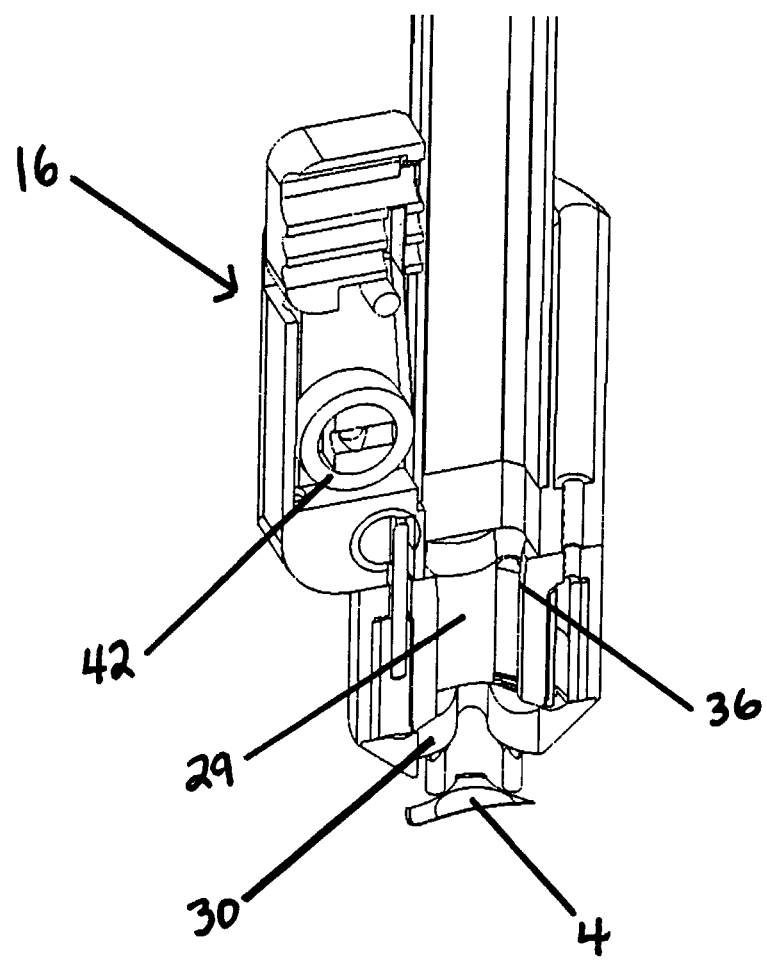
FIG. 17 is a cross sectional view of an inside of a dispenser element according to embodiments of the present invention.
Figure 25:
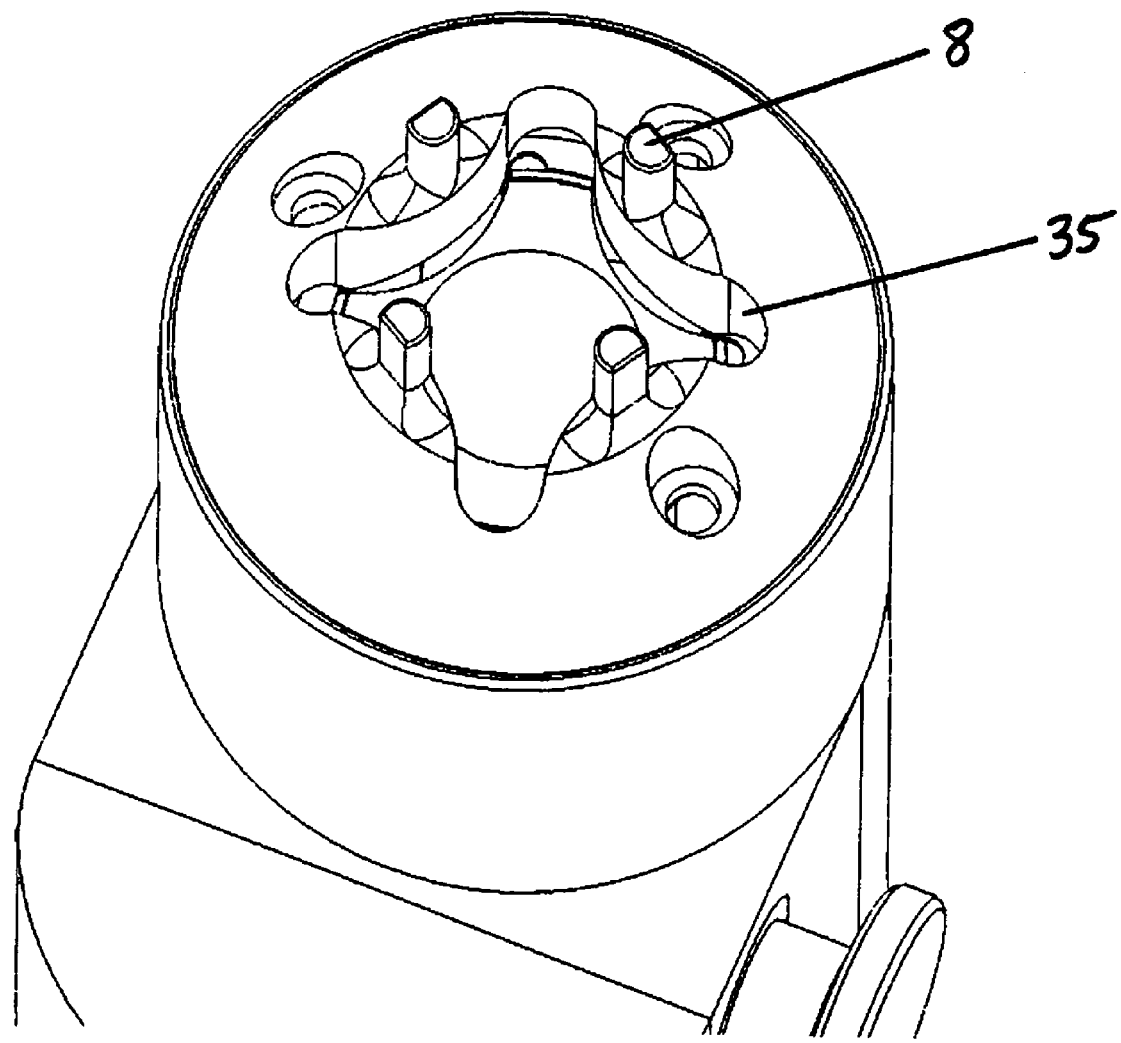
FIG. 25 is a bottom perspective view of a dispenser element end in accordance with embodiments of the present invention.

An inside of a dispenser element may have a surface shaped so as to match a shape of an item, such as a metal dome. An inside surface of a cartridge attached to a dispenser element is shown in FIG. 17. A shaped inner surface of a dispenser element may hold and perhaps even guide a plurality of metal domes through a dispenser element. An opening may be located at an end of a dispenser element which a metal dome may pass through as it may be released from a dispenser element. In embodiments, the present invention may provide an orientation option such as an axially symmetric opening (35) at a foot of a dispenser element which may provide a capability and may even accommodate a metal dome arranged in various positions as shown in FIGS. 11 and 25. This may allow a metal dome positioned in an upright, upside down, face up, face down, combination of these, or the like positions to be dispensed without having to adjust a dispenser element for each position. Of course, in other embodiments, a dispenser element may be designed to allow only one position of a metal dome, perhaps to prevent placement of domes having incorrect orientation.

Figure 16:
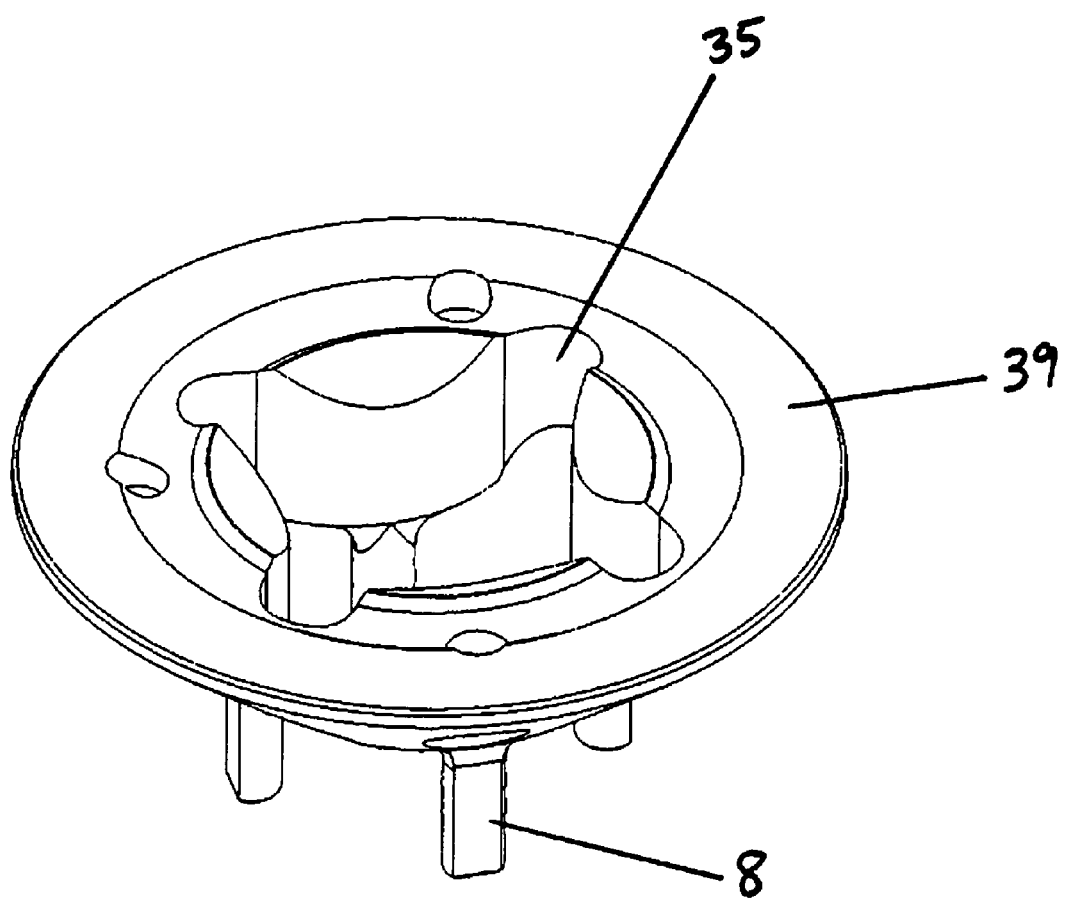
FIG. 16 is an end cap having metal dome exit guides in accordance with embodiments of the present invention.
Figure 26:
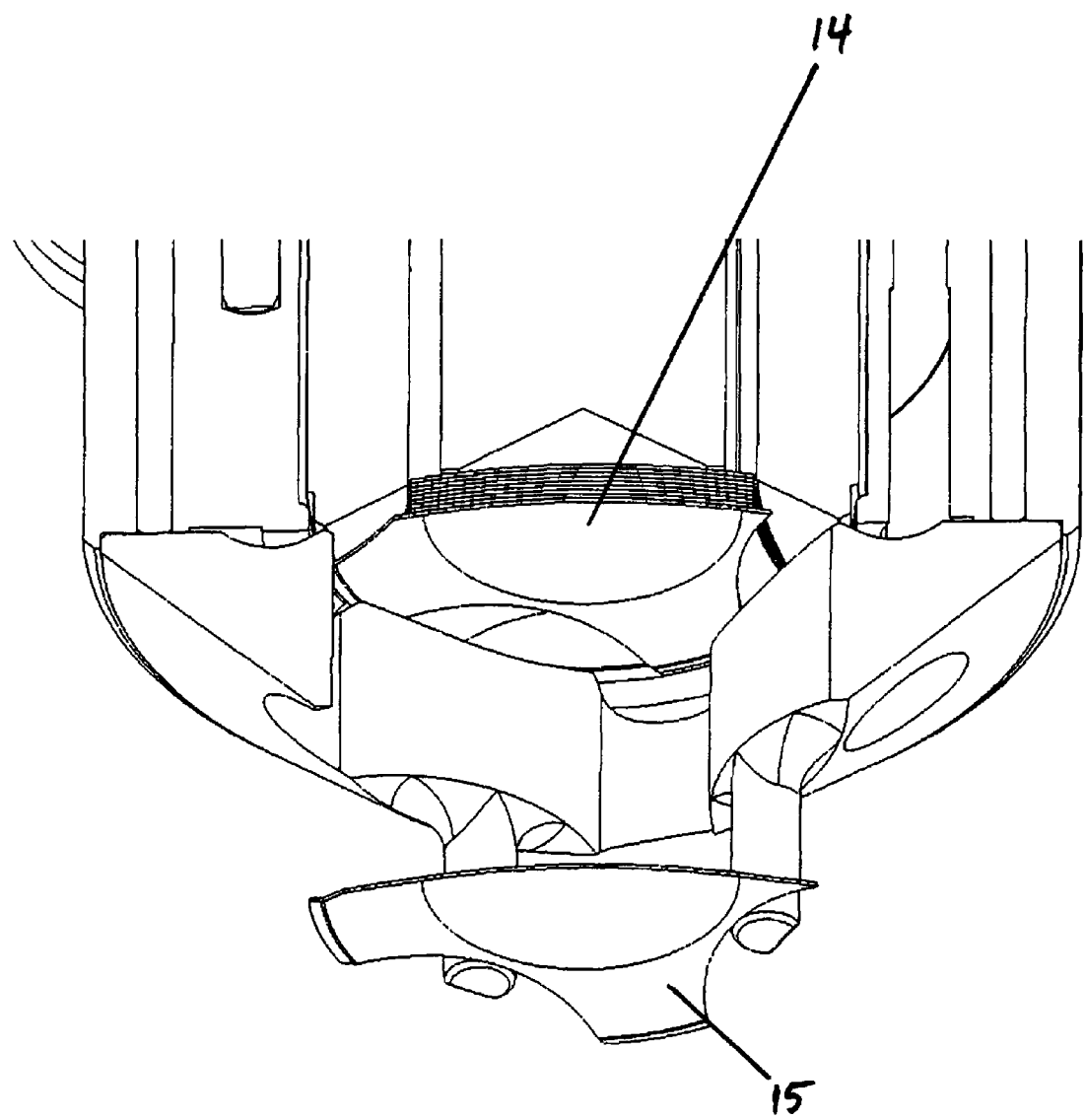
FIG. 26 is a partial side view of an end of a dispenser element showing a dome exiting a dispenser element while another dome may be rotated for exit.
Figure 27:
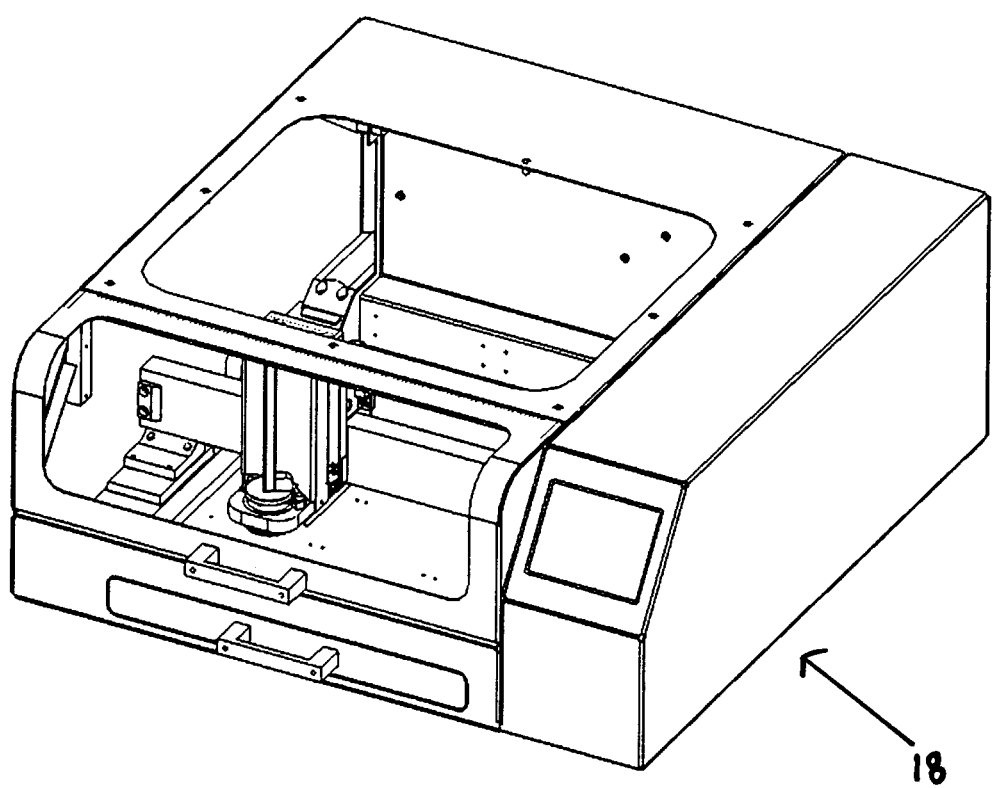
FIG. 27 is a top perspective view of an automated dispenser system in accordance with the present invention.
Figure 28:
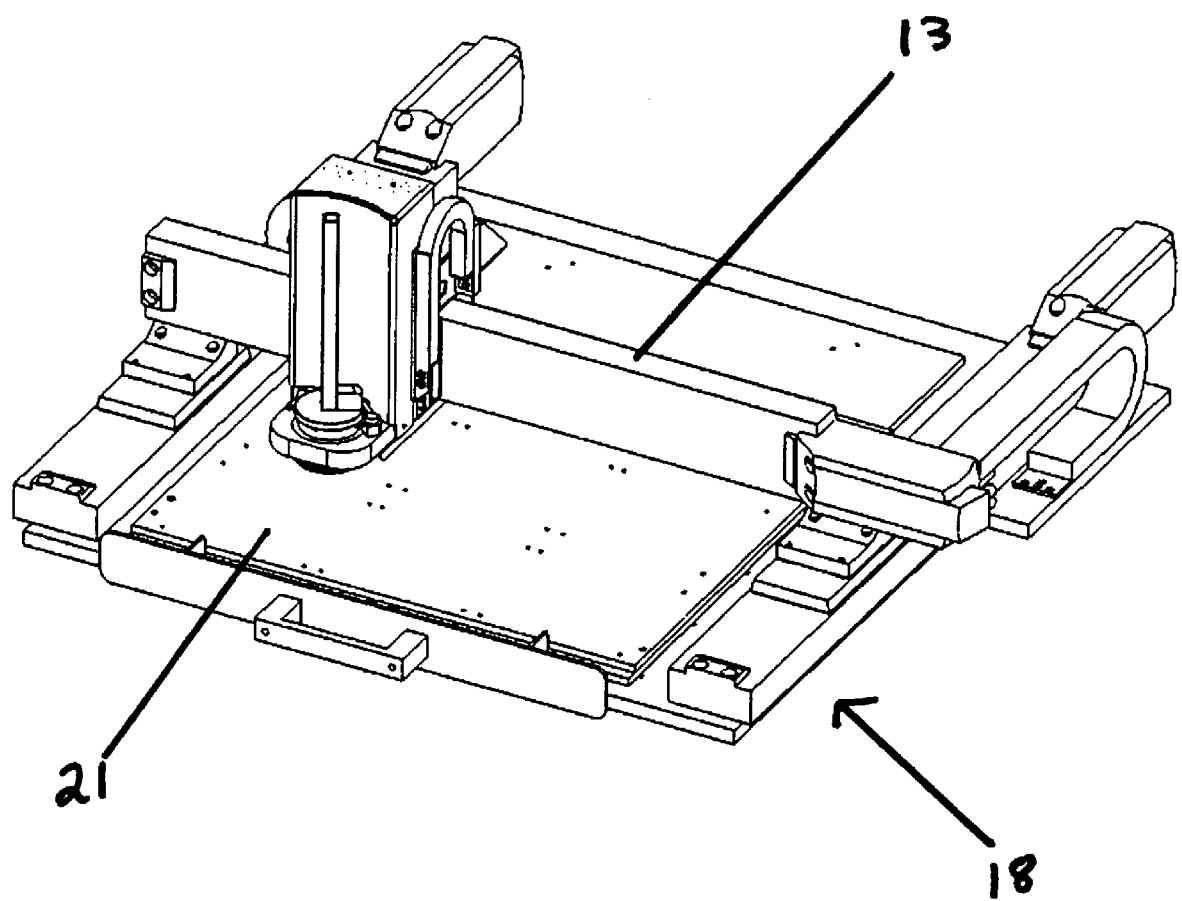
FIG. 28 is a top perspective view of an automated dispenser system having a cover removed in accordance with the present invention.
Figure 29:
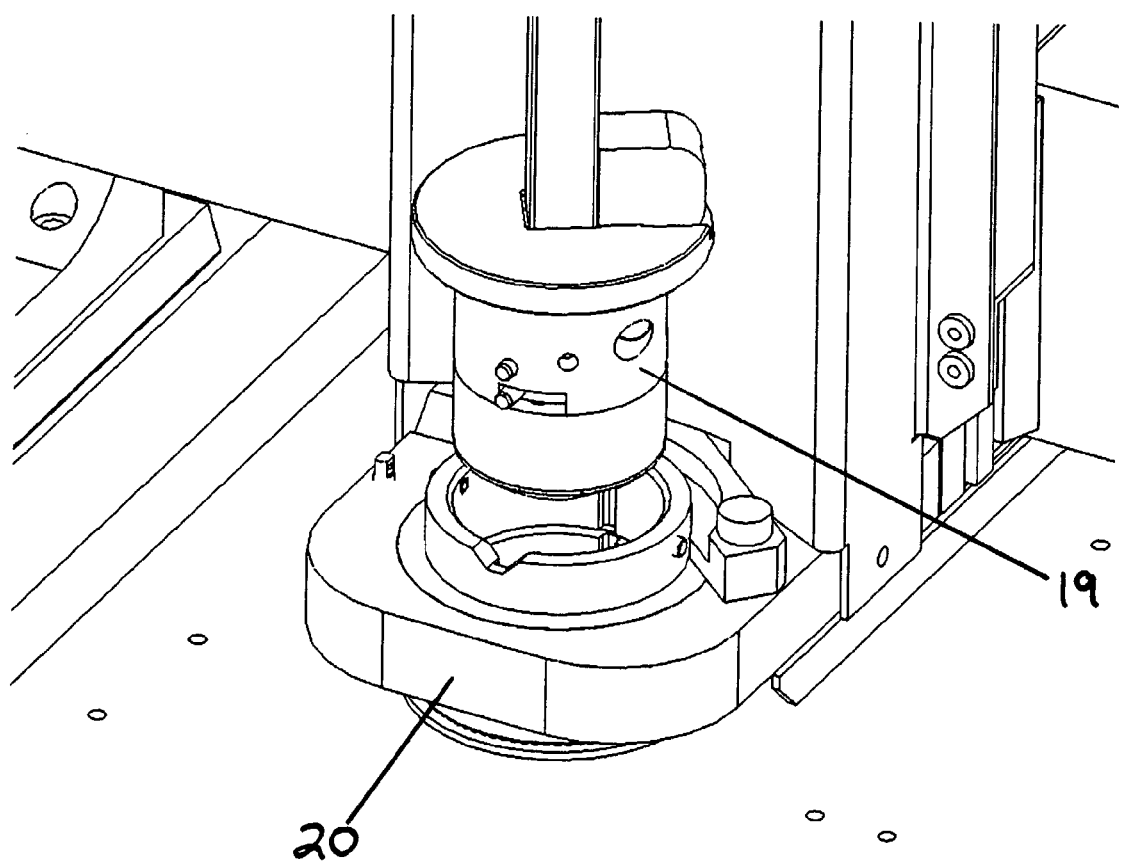
FIG. 29 is a partial side perspective view of an automated dispenser element and corresponding housing in accordance with automated embodiments of the present invention.
Figure 30:
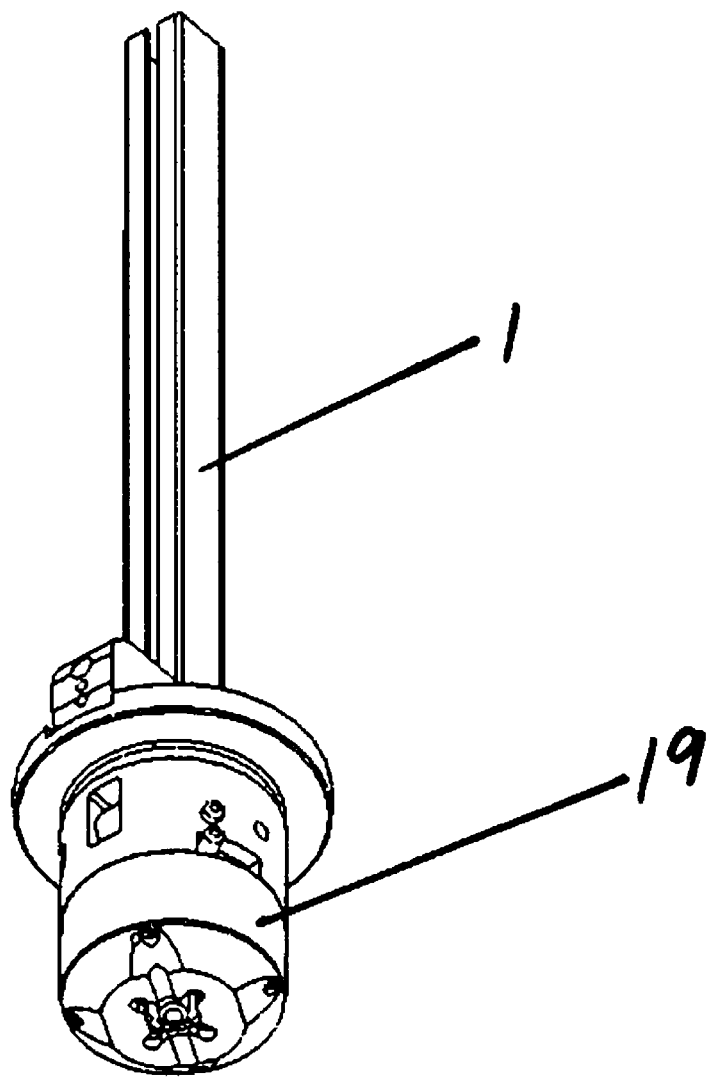
FIG. 30 is a perspective side view of an automated dispenser element in accordance with embodiments of the present invention.
Figure 31:
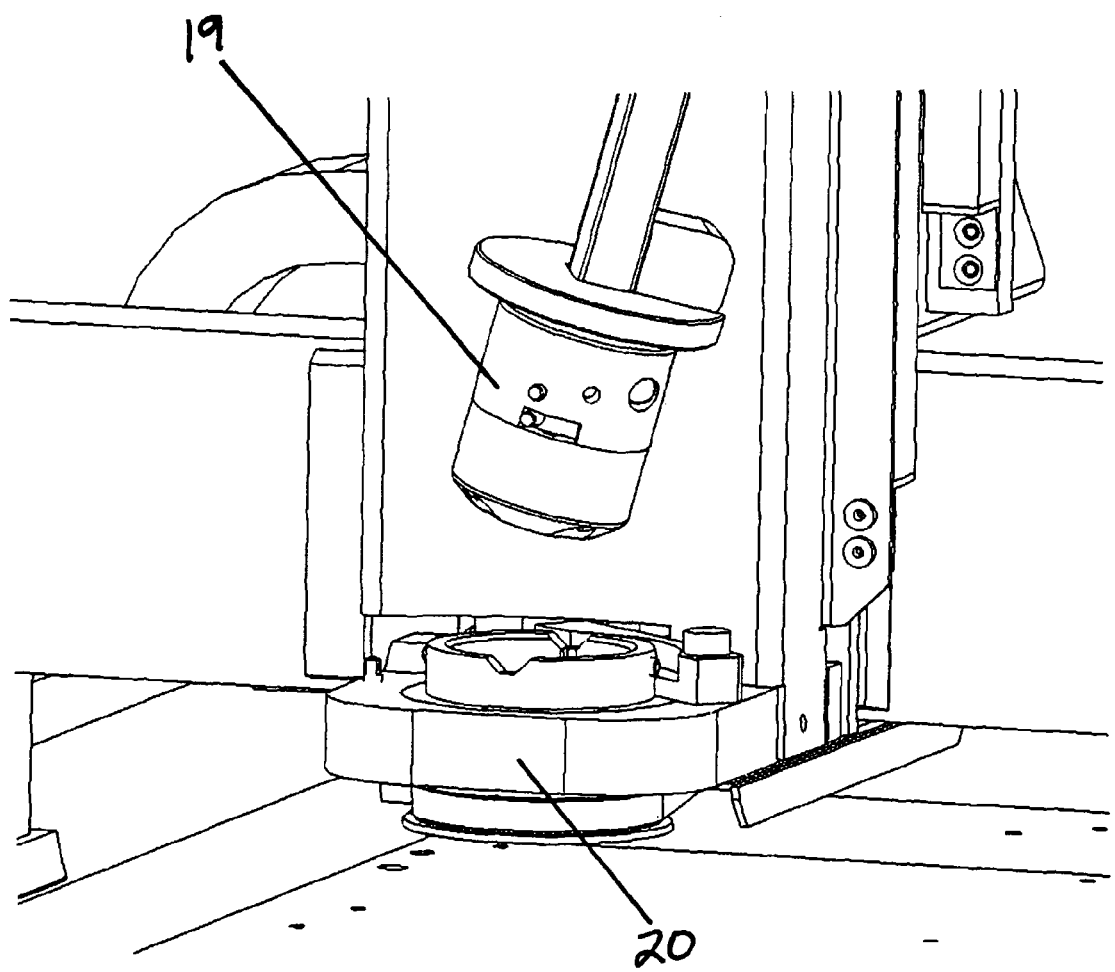
FIG. 31 is a side perspective view of an automatic dispenser system having an automated dispenser element attached to a cartridge showing a dispenser element partially removed in accordance with embodiments of the present invention.

A dispenser system may be positioned upright having a cartridge on an upper end and a dispenser element on a lower end. A dispenser element may move one metal dome, such as a last metal dome (15), from a dome stack within a cartridge and move it through a dispenser element and may even guide a last metal dome (15) as it may drop onto a metal dome placement position. A tapered element may be part of a dispenser element which may be attached at an end of cartridge. An inside of a tapered element (36) may taper and allow a close tolerance between a metal dome and an inside surface of a tapered element than that of a tolerance between a metal dome and an inside surface of a cartridge. A cartridge may be looser fitting for ease of use and may allow a dome stack to move along the inside of a cartridge. An inside surface of tapered element may substantially match an exterior shape of a metal dome in embodiments, while allowing the metal dome to pass through it. Close fitting surfaces within a tapered portion of a dispenser element may control each dome closely. A metal dome may be guided with a metal dome exit guide (39) such as with at least one pin guide (8) as shown in FIGS. 16 and 26. In embodiments, a pin guide (8) may have four pin guides or may have any number of pins, machined fingers, shaped profile or the like. A guide may position a metal dome for placement while dropping onto a surface. It may also act as a visual reference to assist an operator in positioning a dispenser element to enable a dome to be dropped in the correct position.

In other embodiments, the present invention may include a metal dome separator (9) so as to separate one metal dome from a plurality of arranged metal domes prior to a dispensing step. In embodiments, dispensing may include a release of a separated metal dome onto a placement position, and in other embodiments, dispensing may include unidirectionally dispensing of a separated metal dome from a plurality of arranged metal domes onto at least one metal dome placement position, both as previously discussed. A metal dome separator may include a metal dome rotation mechanism (22) as discussed herein.

Figure 12:
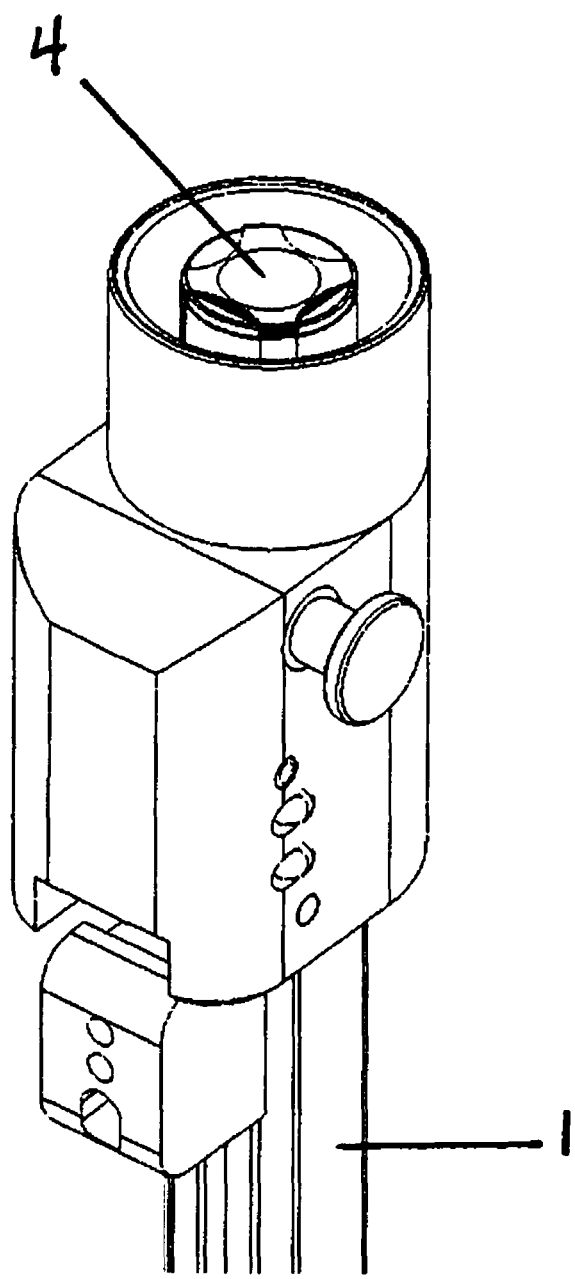
FIG. 12 is a perspective view of an end of a dispenser element with an end cap and blade removed in accordance with embodiments of the present invention.
Figure 13:
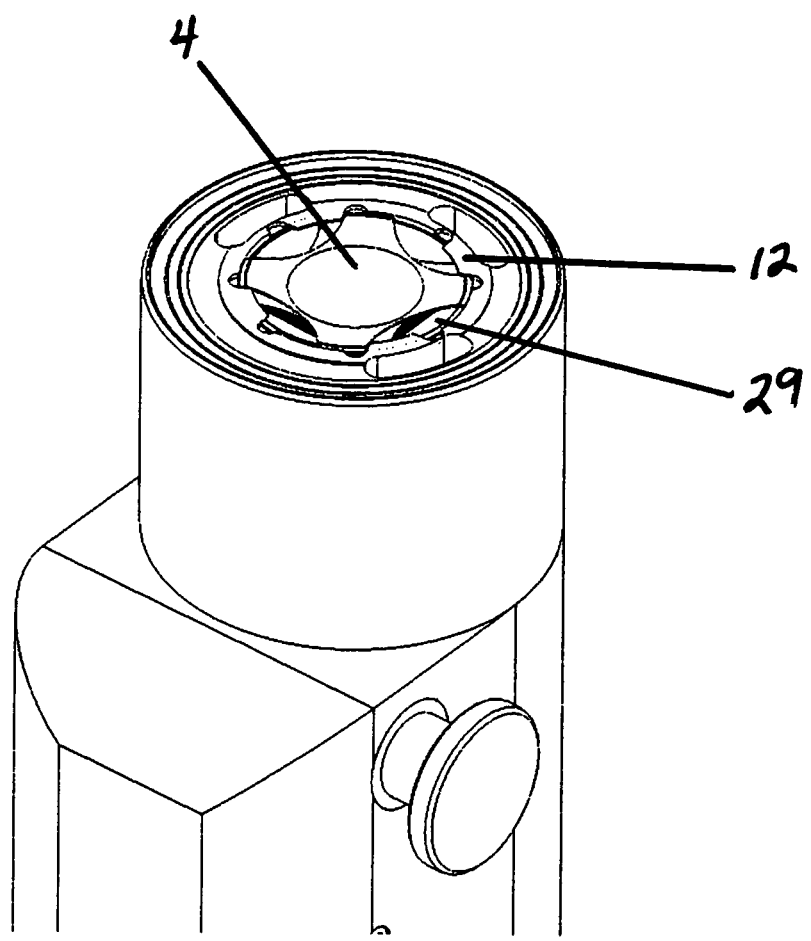
FIG. 13 is a perspective view of an end of a dispenser element showing a rotation of a dome with a rotation blade in accordance with embodiments of the present invention.
Figure 14:
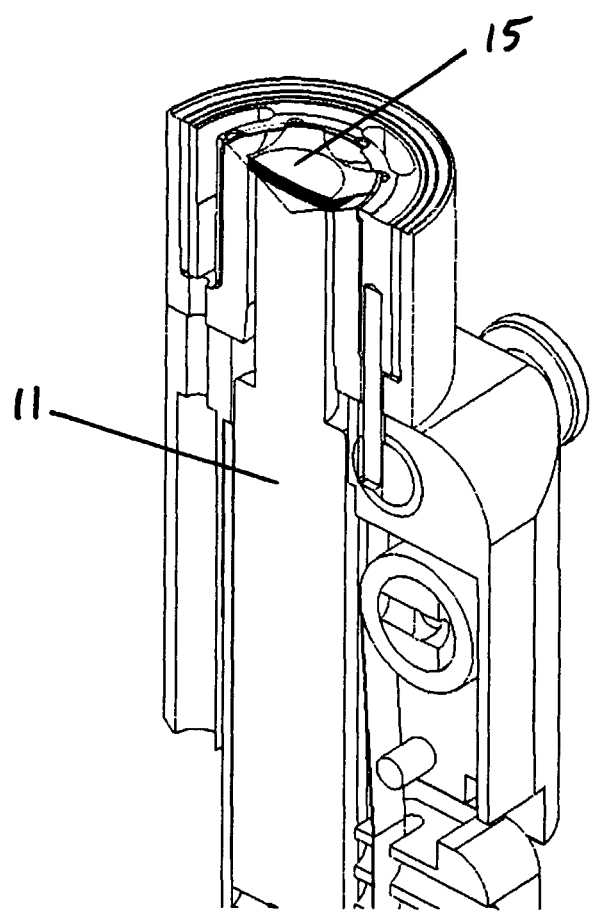
FIG. 14 is a cross sectional view of a dispenser element, cartridge and plunger in accordance with various embodiments of the present invention.

In embodiments, the present invention may provide rotating one metal dome before releasing one metal dome from a dispenser end with a metal dome rotation element. In embodiments, a metal dome may be rotated prior to it exiting a dispenser element and dropping onto a surface. As a dome may approach an opening to be dispensed, it may be prevented from exiting until it may be rotated. Rotation of one metal dome, such as a last metal dome (15) may provide avoidance of at least one projection (12) as discussed above. Dome rotation may be a rotation that may move a dome or the like enough so that it may be at a different angle than a dome that may preceed it. Accordingly, in embodiments, a metal dome may be pushed in a rotary fashion as can be shown in FIGS. 12, 13 and 14. A dome may be rotated by a rotation plate (10). A rotation plate may be moved by a trigger, in which a user may manually push a button or perhaps in other embodiments, a rotation blade may be moved by a motor or the like in automated embodiments. A rotation blade may be attached to a bearing surface in a cylinder. In embodiments, a trigger (7) may be connected to a ring link (24) which in turn may be connected to a ring (23). When a trigger may be pushed, such as in a linear direction, a ring link may move and a ring may rotate. At an end of a ring, a rotation plate (10) may respond by rotating.

Rotation of a dome to be dispensed may be useful to prevent at least two domes from sticking together and dispensing of multiple domes at a time. A rotary sheer design may provide precise rotation with a metal dome surface. Profiled surfaces may match a shape of a dome and may allow a last dome in the stack to rotate while holding the rest back. In other embodiments, the present invention may include providing matched offset dome profile surfaces in a dispenser element. This may include a first profile surface (29) and matched offset second profile surface (30). When a metal dome may not be dispensed, it may be held within a cartridge and dispenser element with a matched offset profile surface. These surfaces may be used when dispensing a last metal dome from a cartridge and may even include moving a last metal dome into a first profile surface, holding a last metal dome in a dispenser element with a second offset profile surface and perhaps even rotating a last dome clear of a second offset profile surface. For example, a dome may be rotated about thirty degrees.

After a button may be pushed, a rotation blade may rotate a dome and the dome may drop out of the dispenser element using guide surfaces or pins as previously described. A button release, such as a spring or the like may move a button in the opposite direction, allowing a rotation blade to slide into its original position.

In embodiments, metal domes may be dispensed manually such as shown in FIGS. 18, 19, 20 and 21. A cartridge may be attached to a dispenser element. A user may manually move a dispenser end of a cartridge and a plurality of domes contained therein over at least one placement position. One metal dome may be manually released from a dispenser end of a cartridge onto a placement position with a manual metal dome dispenser. A metal dome dispenser may be capable of manual release of each of a plurality of metal domes. A dispenser element may include a trigger (7), which may be manually engaged by a user. A trigger (7) may include any element, such as an act or perhaps even an event, that may serve as a stimulus and may even initiate a reaction or series of reactions. Examples of a trigger may include, but are not limited to, a lever, button and the like. A user may manually engage a trigger (7), apply force to a trigger and perhaps even engage a metal dome rotation mechanism (22). Engagement of a metal dome rotation mechanism (22) such as a manual metal dome rotation mechanism, may include, in embodiments, moving a ring link attached to and perhaps even responsive to a trigger (7), moving a ring (23) responsive to a ring link (24), moving a rotation plate (10) attached to an inside of a ring (23), and perhaps even rotating a last metal dome with a rotation plate.

Figure 18:
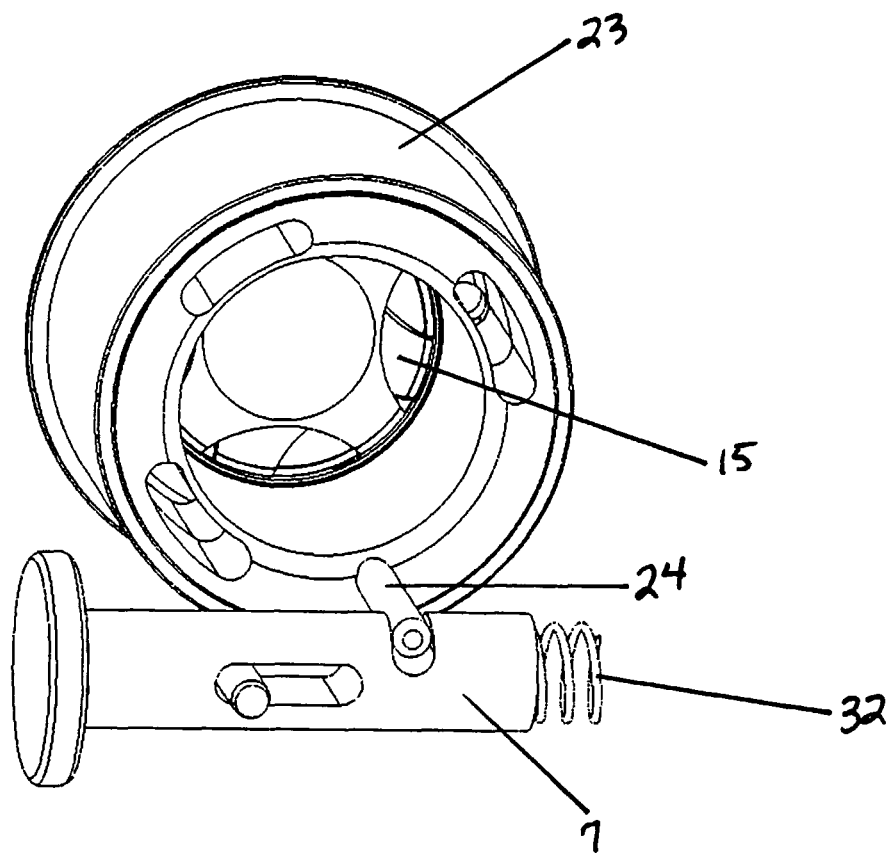
FIG. 18 shows a lever attached to a rotational mechanism and last metal dome when the metal dome rotational mechanism may be completely engaged in accordance with embodiments of the present invention.
Figure 19:
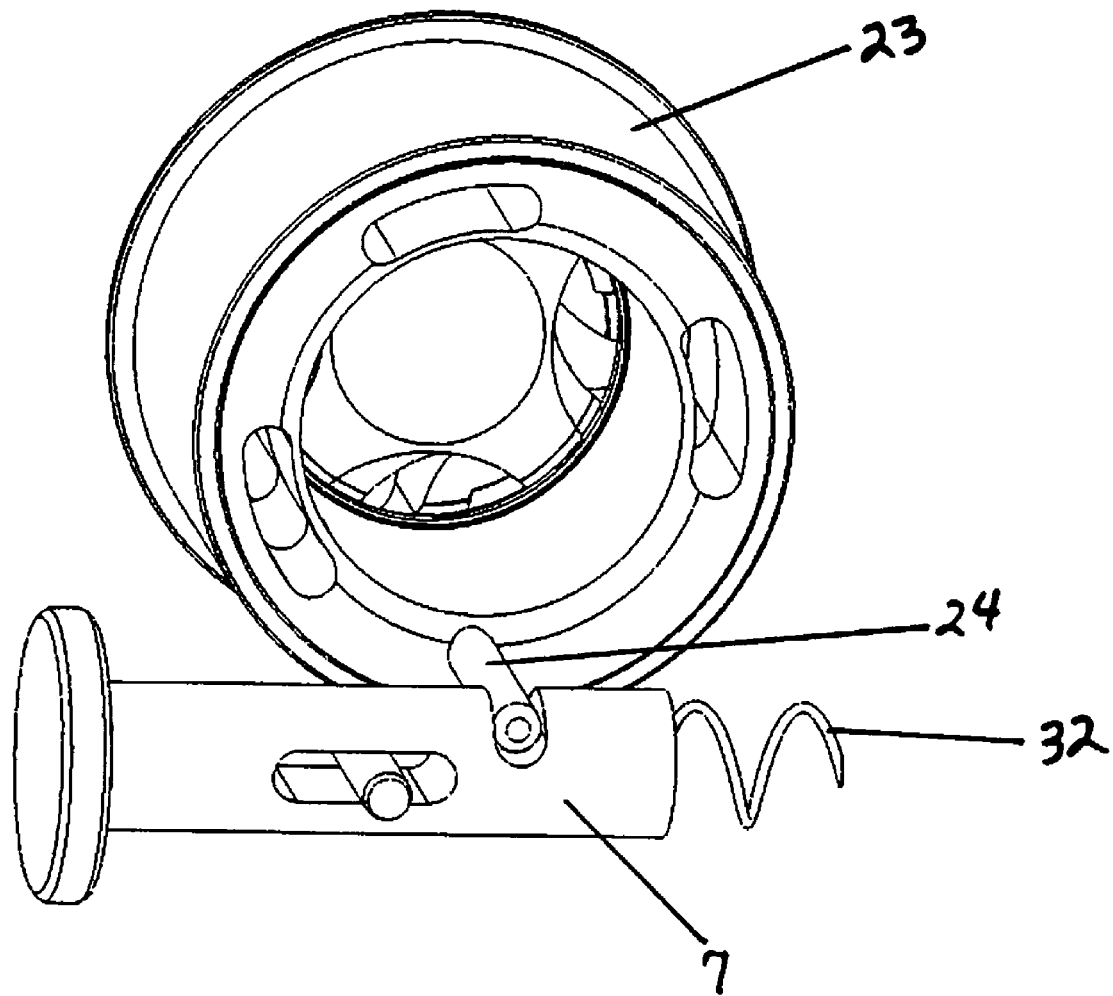
FIG. 19 shows a lever attached to a rotational mechanism and last metal dome when a metal dome rotational mechanism may be partially engaged in accordance with embodiments of the present invention.
Figure 20:
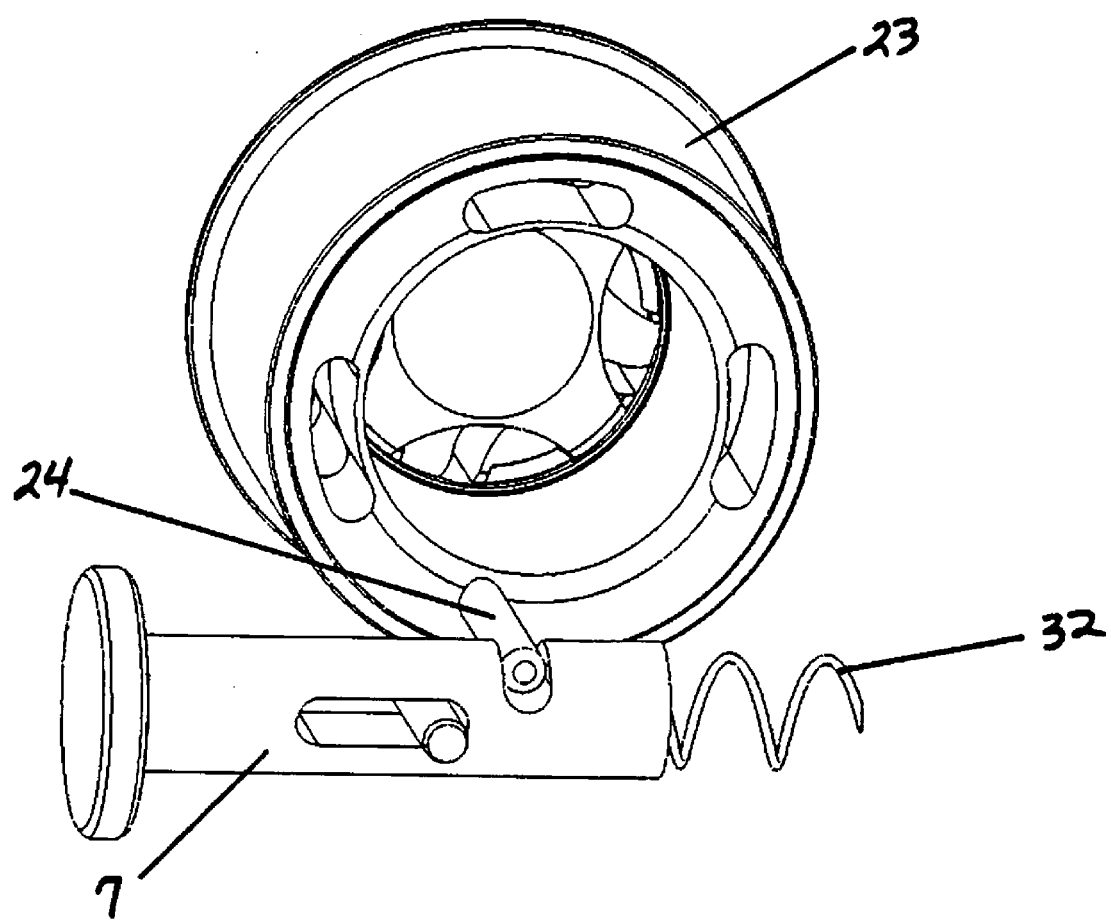
FIG. 20 shows a lever attached to a rotational mechanism and last metal dome when the metal dome rotational mechanism may be unengaged in accordance with embodiments of the present invention.
Figure 21:
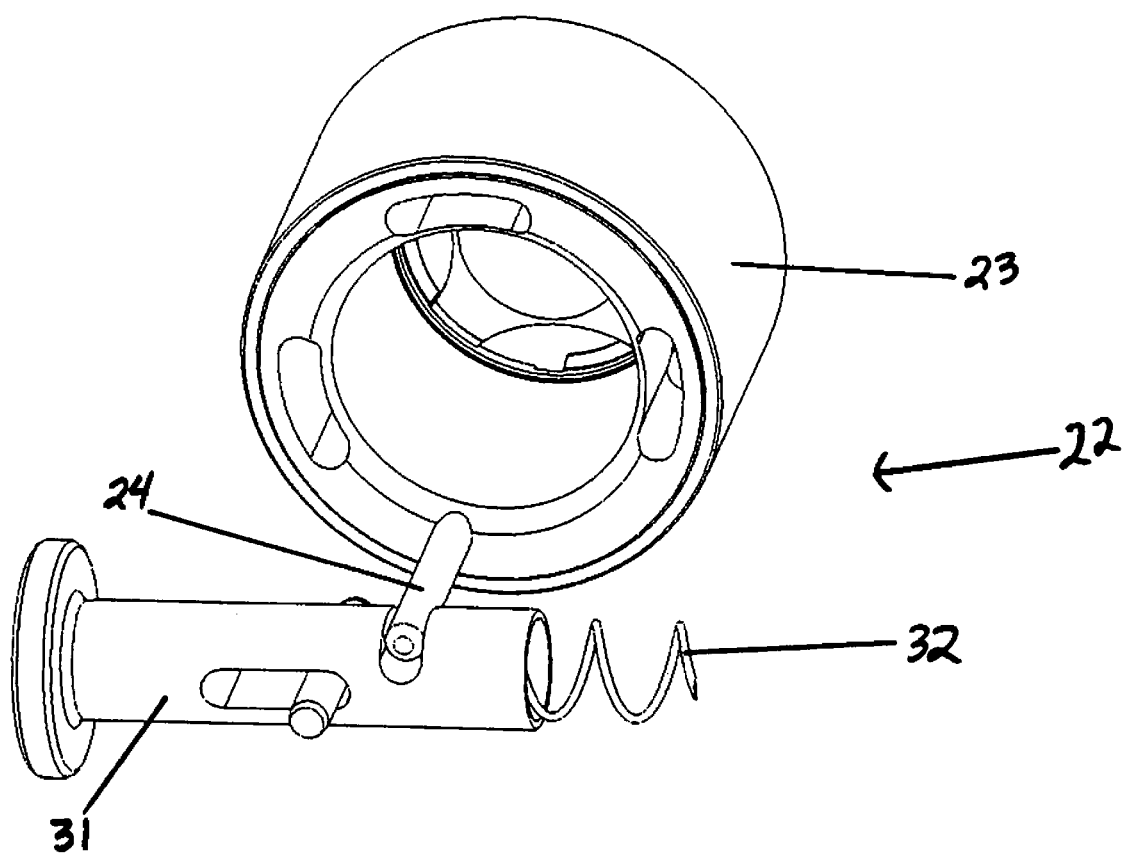
FIG. 21 is an exploded view of a button and ring link in accordance with embodiments of the present invention.
Figure 22:
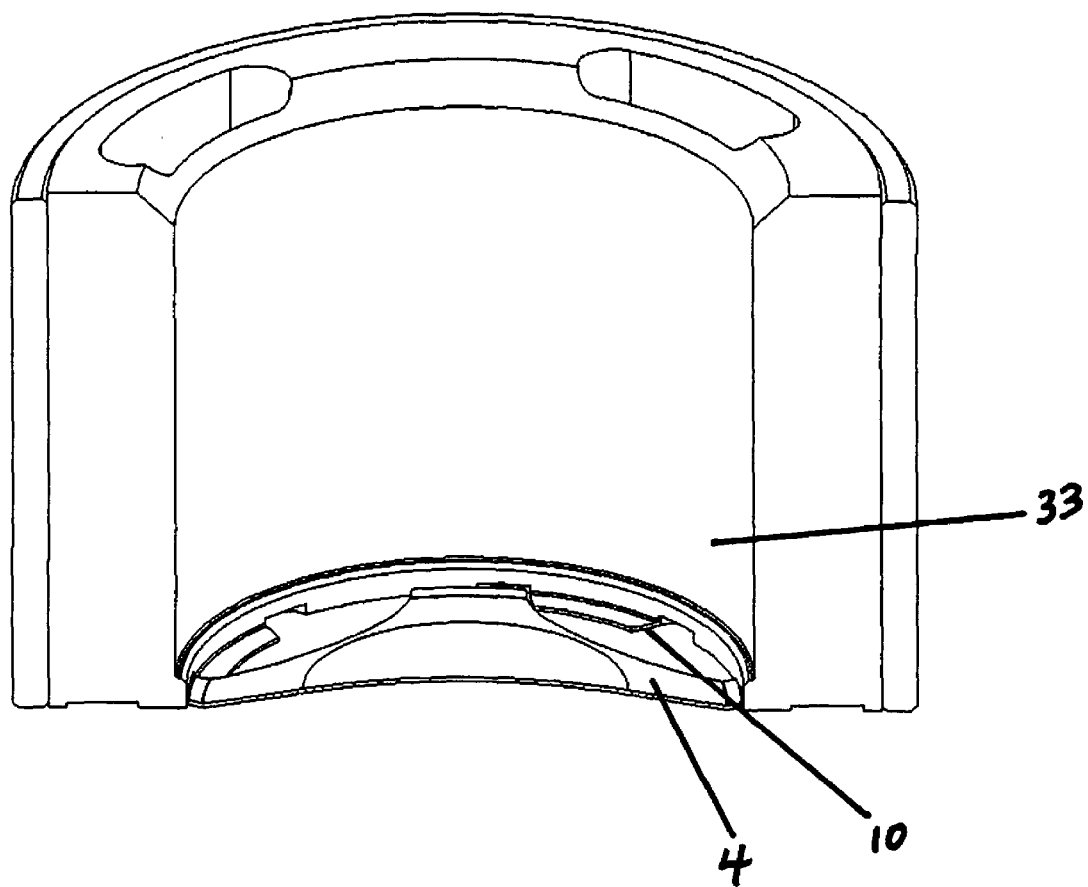
FIG. 22 is a partial exploded view of rotation blade engaged with a metal dome in accordance with embodiments of the present invention.
Figure 23:
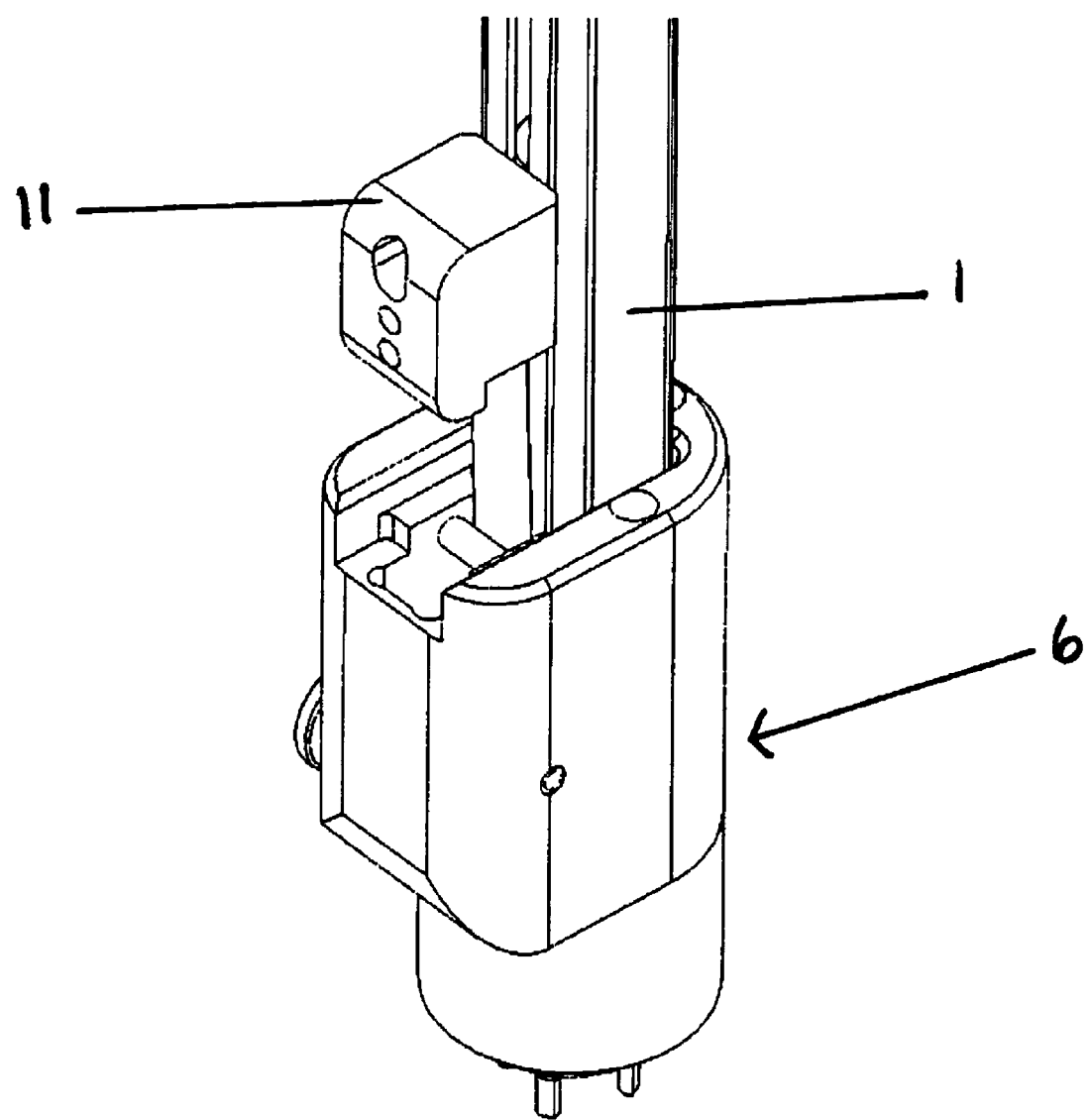
FIG. 23 is a side perspective view of a dispenser element, spring mechanism and cartridge in accordance with embodiments of the present invention.
Figure 24:
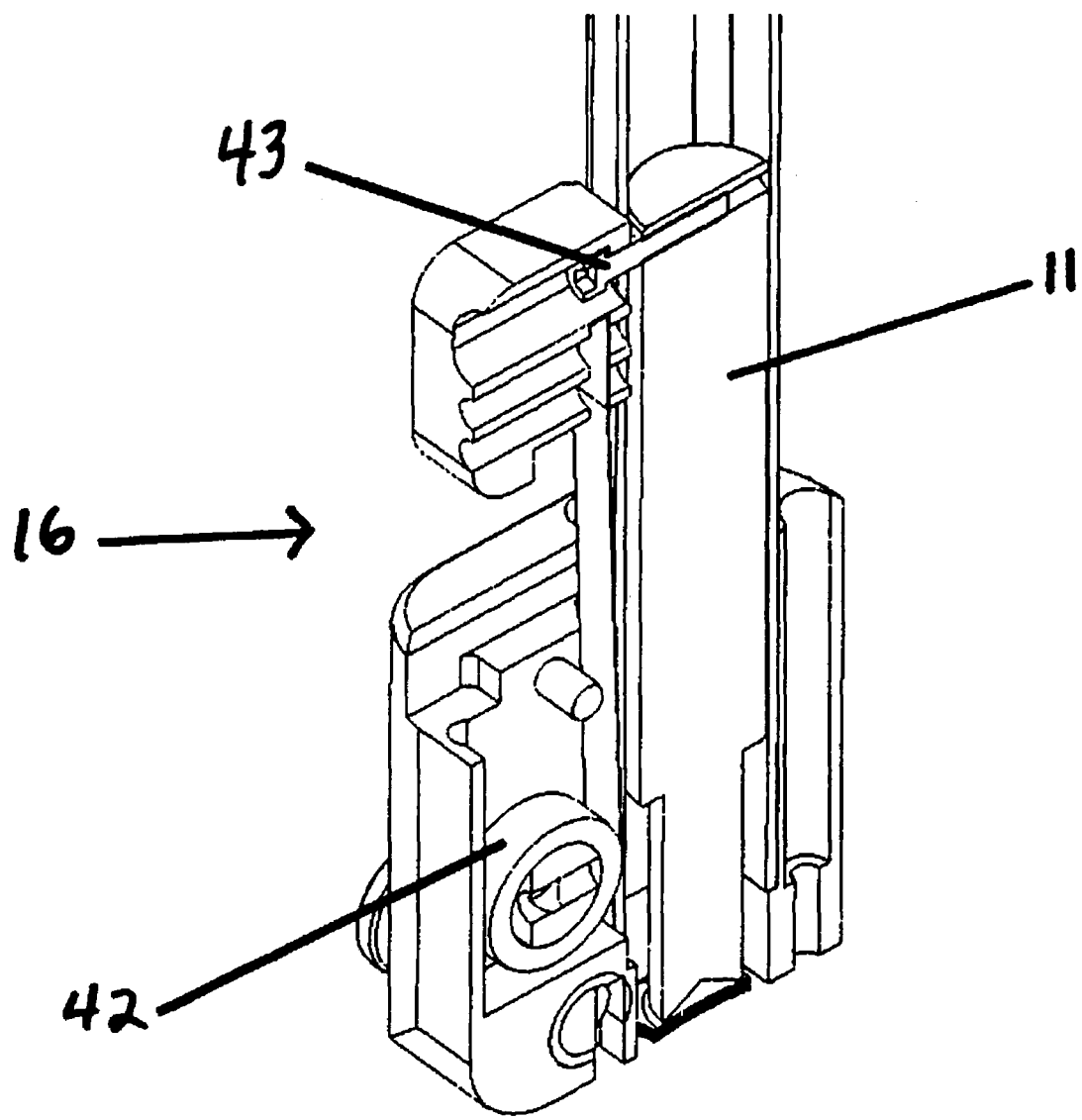
FIG. 24 is a cross sectional view of a dispenser element, spring mechanism and cartridge in accordance with embodiments of the present invention.

A manual metal dome rotation mechanism may be engaged and disengaged. FIG. 18 show a trigger, ring, ring link and metal dome in a position when a rotation mechanism may be completely engaged. FIG. 19 shows these elements in a partially engaged position and FIG. 19 shows these elements in an unengaged position. A manual metal dome rotation mechanism may be a mechanism which may rotate a last metal dome in order to dispenser it. A last metal dome may be responsive to a rotation plate. By responsive, a first element may act in response to a second element such as but not limited to by movement, actions, events and the like. In other embodiments, a ring link may be moveably responsive to a trigger, a ring may be rotationally responsive to a ring link, a rotation plate may be rotationally responsive rotation to a ring link, and perhaps even a last metal dome may be rotationally responsive to a rotation plate. A rotation plate (10) may include a thin blade, in embodiments. A thin blade may be a blade that is less than or even equal to a dome thickness as can be seen in FIG. 22.

An engagement element of a manual metal dome rotation mechanism may be provided in embodiments. For example, an engagement element of a metal dome rotation mechanism may be used as well as a disengagement element of manual metal dome rotation mechanism. In manual embodiments, a manual engagement element and perhaps a manual disengagement element of a metal dome rotation mechanism may be provided. A manual engagement element of a metal dome rotation mechanism may include user force applied to a trigger, button and the like. Disengaging a metal dome rotation mechanism may include reversely moving ring link attached to a trigger, reversely moving a ring responsive to a ring link, and perhaps even reversely moving a rotation plate attached to an inside of ring (33). A disengagement element of a metal dome rotation mechanism may include a biased spring, force applied by a user and the like. In other embodiments, the present invention may include manually disengaging a trigger. A user may release a force applied to trigger which may allow a trigger to move back to a first position (31). In embodiments, a user may apply force to a trigger to move a trigger back to an first position or perhaps may even provide moving a trigger back to first position with a spring (32) biased toward first position. After a first manual dispensing of a metal dome, a user may manually move a cartridge and a plurality of arranged metal domes above another metal dome placement position, engage a trigger, releasing a last metal dome, and perhaps even release a trigger.

In alternative embodiments, the present invention may provide for an automated dispenser system (18) for dispensing items such as metal domes. Accordingly, a metal dome dispenser may be capable of automatic release of each of a plurality of arranged metal domes. As can be seen in FIGS. 27-33, a dispenser end of a cartridge (1) may be attached to or perhaps may even be placed into an automated metal dome dispenser element (19). Automated housing (20) may removably receive an automated dispenser element and may even allow an automated dispenser element to slide into its corresponding housing. An automated dispenser element may include a rotation blade, ring, opening for exit of each metal dome, exit pins and the like, in various embodiments. Automated housing may be attached to moveable parts which may allow an automated dispenser element (19) and cartridge to move along a surface (21) or the like for placement of domes onto a placement position. For example, a robot arm (13) may be connected to an automated housing (20). In embodiments, the present invention may provide for automatically moving an automated dispenser element above at least one metal dome placement position. This may be achieved by a robot arm (13) or the like.

In embodiments, the present invention may provide automatically releasing one metal dome from a dispenser end of a cartridge onto at least one metal dome placement position. Automatic release may include automatic engagement of at least one metal dome with a metal dome rotation mechanism such as an automatic metal dome rotation mechanism. An automatic metal dome rotation mechanism may include automatically moving a ring, automatically moving a rotation plate attached to an inside of a ring and perhaps even rotating a last metal dome with a rotation plate. In embodiments, an automatic metal dome mechanism may include a movable ring and a rotation plate connected to an inside of a moveable ring. A last metal dome may be responsive to a metal dome rotation mechanism. An automatic metal dome rotation mechanism may be moved automatically such as with a motor and perhaps even computer.

Figure 32:
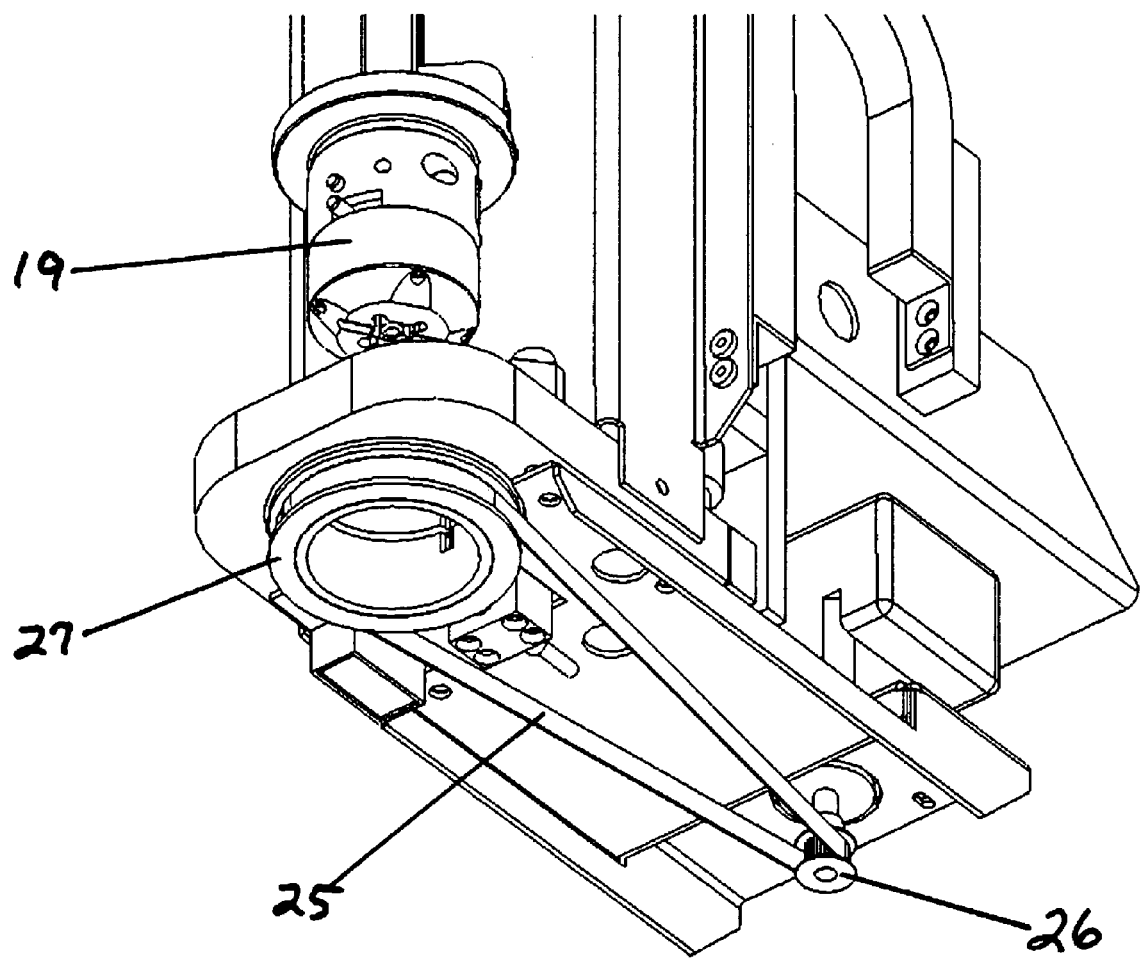
FIG. 32 is a partial bottom view of a ring and motor of the present invention.
Figure 33:
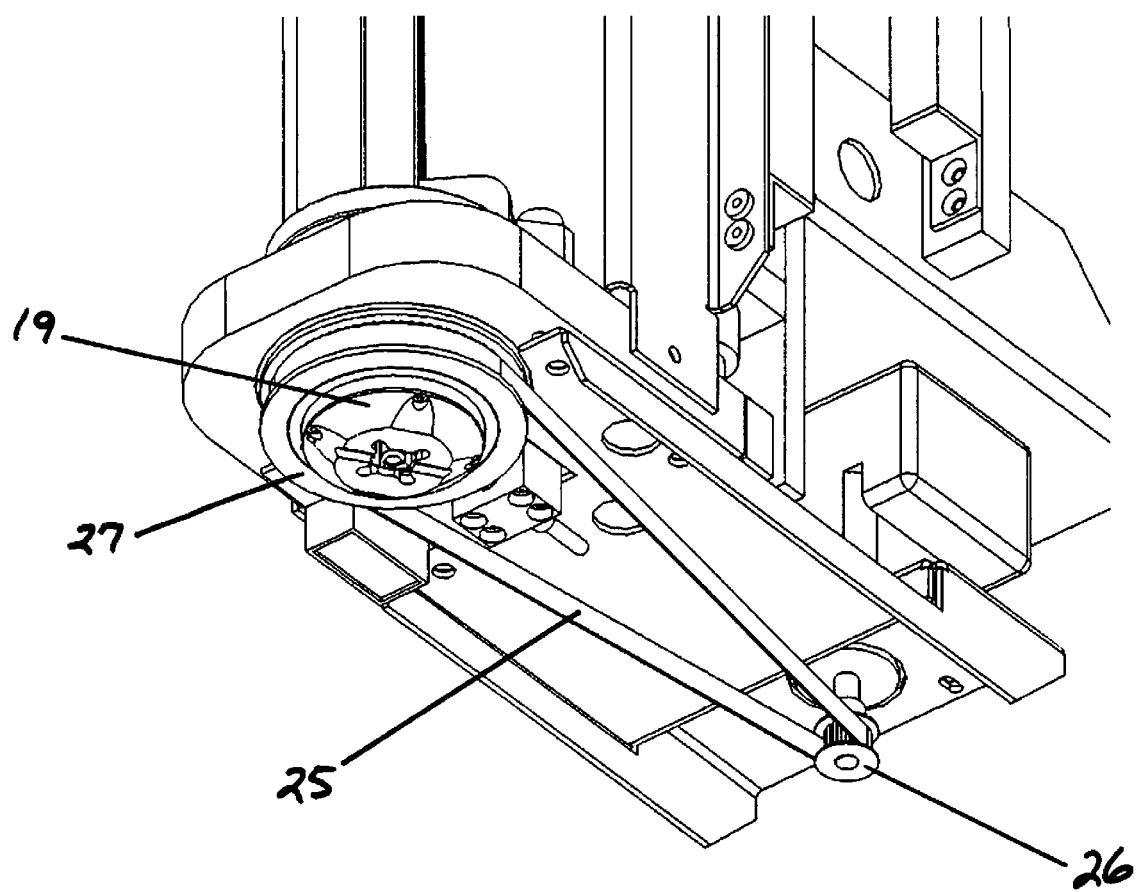
FIG. 33 is a bottom perspective view of an automated dispenser element attached to its corresponding housing in accordance with automated embodiments of the present invention.

Automated housing may include a rotation system, possibly located under the housing as shown in FIGS. 32 and 33. A rotation system may have a pulley such as a two wheels which may drive a belt (25) by a first wheel (26) connected to a stepper motor which may act to rotate a second wheel (27) at a particular speed and rotation. Two sided pins may be used in embodiments for rotation. A rotation system may provide rotation of a single dome so that it may drop out of a dispenser element and automated housing onto a placement position (21). A dome may be guided by pins, such as four pins as previously discussed and as shown in FIG. 26. A rotation system may also rotate an entire dispenser element to place domes at various positions.

In automated embodiments, the present invention may provide an engagement element such as an automated engagement element of an automated metal dome rotation mechanism and perhaps even a disengagement element such as an automated disengagement element of an automated metal dome rotation mechanism. An automated engagement or disengagement element may include a motor and the like connected to metal dome rotation mechanism. Automatically disengaging a metal dome rotation mechanism may include reversely moving a ring and perhaps even reversely moving a rotation plate attached to an inside of a ring. In embodiments, a computer may be attached to an automated dispenser system.

Programming may permit dome orientation change and may provide proper rotation for the dropping of a dome. A friction hold may be used for dome drop orientation. In other embodiments, a laser, photosensor, digital camera or touch probe may be utilized to look at the edges of a dome and perhaps even look at the desired location of the dome to be placed. A laser may provide position confirmation for each dome as it is to be dropped to ensure that a dome may be correctly placed. It may also locate the part or fixture which can receive metal dome with a distinctively colored feature which can be detected by a laser as it moves by.

It may be desirable, in embodiments, to provide an automated system which can efficiently place each dome onto a surface. Each surface for dome placement may have different places in which domes need to be positioned. For each new surface, a computer program can be designed for optimum sequence and timing, such as by calculating an efficient route for placement of the domes. A CAD image may be captured and used for such computation. This may also provide alignment of an automated dispenser element and housing to the particular surface. An efficient embodiment of the present invention may allow the cartridge and domes to move with an automated dispenser element and housing while assembling each product and the like. Automated dispenser systems may count the number of domes placed in embodiments. It may be desirable to provide a PC in connection with such automated systems. The present invention may provide a slide, conveyor, automatic rotary table and the like for part change out such as to load a next part or reel or the like.

In alternative embodiments, the present invention may provide a dual head design. This may allow at least two sets of domes to be placed onto a surface or surfaces. A docking station may be provided for other parts such as other heads, diodes, dispensers for solder paste or glue and the like. It may be desirable to provide a testing system of metal domes after they have been distributed or released onto a surface or placement position or perhaps even before application. Testing may include testing a position of a metal dome, actuation force of a metal dome, contact closure testing and the like.

The present invention may provide a system that allows fast placement of domes and the like either manually or automated. Automation may allow placement of domes at greater than about 2000 per hour, greater than about 3000 per hour, greater than about 4000 per hour, greater than about 5000 per hour and more. Manual placement of domes and the like may include greater than about 600 per hour, greater than about 1000 per hour, greater than about 1500 per hour, at or greater than about 2000 per hour and perhaps even at or greater than about 2400 per hour. These are merely examples and any rate is intended to be included in this disclosure. In embodiments, a placement system may have a high manual placement productivity.

As can be easily understood from the foregoing, the basic concepts of the present invention may be embodied in a variety of ways. It involves both dispensing techniques as well as devices to accomplish the appropriate dispenser In this application, the dispensing techniques are disclosed as part of the results shown to be achieved by the various devices described and as steps which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims in this or any subsequent patent application.

It should also be understood that a variety of changes may be made without departing from the essence of the invention. Such changes are also implicitly included in the description. They still fall within the scope of this invention. A broad disclosure encompassing both the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "dispenser" should be understood to encompass disclosure of the act of "dispensing"—whether explicitly discussed or not—and, conversely, were there effectively disclosure of the act of "dispensing", such a disclosure should be understood to encompass disclosure of a "dispenser" and even a "means for dispensing" Such changes and alternative terms are to be understood to be explicitly included in the description.

Any patents, publications, or other references mentioned in this application for patent are hereby incorporated by reference. In addition, as to each term used it should be understood that unless its utilization in this application is inconsistent with such interpretation, common dictionary definitions should be understood as incorporated for each term and all definitions, alternative terms, and synonyms such as contained in the Random House Webster's Unabridged Dictionary, second edition are hereby incorporated by reference. Finally, all references listed in the list presented below or other information statement filed with the application are hereby appended and hereby incorporated by reference, however, as to each of the above, to the extent that such information or statements incorporated by reference might be considered inconsistent with the patenting of this/these invention(s) such statements are expressly not to be considered as made by the applicant(s).

I. U.S. PATENT DOCUMENTS

| DOCUMENT NO. & KIND CODE (if known) | PUB'N DATE mm-dd-yyyy | PATENTEE OR APPLICANT NAME | CLASS | SUBCLASS | FILING DATE mm-dd-yyyy |
|---|---|---|---|---|---|
| 5,388,467 | 02/14/1995 | Jereb, et. al | 73 | 862.381 | 09/09/1992 |
| 4,033,030 | 07/05/1997 | Robinson et al. | 29 | 622 | 03/15/1976 |
| 4,153,987 | 05/15/1979 | Boulanger | 29 | 622 | 02/14/1977 |
| 3,886,012 | 05/27/1975 | Slater | 156 | 73.1 | 08/13/1973 |
| 4,314,117 | 02/02/1982 | Ditzig | 200 | 5 A | 07/24/1980 |

II. FOREIGN PATENT DOCUMENTS

| Foreign Patent Document Country Code, Number, Kind Code (if known) | PUB'N DATE mm-dd-yyyy | PATENTEE OR APPLICANT NAME |
|---|---|---|
| WO 00/68964 | 16/11/2000 | Lecourtois |
| WO 96/20799 | 11/07/1996 | Lecourtois |
| EP 0 825 913 B1 | 21/11/1996 | Girard, et. Al |
| EP 0 800 426 B1 | 11/07/1996 | Lecourtois |

III. OTHER DOCUMENTS

"Assisting our Customers in Reducing Their End Product Costs Through Mechanization And Automation Of Our Products," www.bowman-domes.com/automation.htm; Feb. 09, 2005; 7 pages.
US Provisional Application S/N 60/638,917 filed Dec. 23, 2004 entitled "Efficient Switch Contact Delivery and Placement Systems"

Thus, the applicant(s) should be understood to have support to claim and make a statement of invention to at least: i) each of the dispensing devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) the various combinations and permutations of each of the elements disclosed, and xii) each potentially dependent claim or concept as a dependency on each and every one of the independent claims or concepts presented.

In addition and as to computer aspects and each aspect amenable to programming or other electronic automation, the applicant(s) should be understood to have support to claim and make a statement of invention to at least: xii) processes performed with the aid of or on a computer as described throughout the above discussion, xiv) a programmable apparatus as described throughout the above discussion, xv) a computer readable memory encoded with data to direct a computer comprising means or elements which function as described throughout the above discussion, xvi) a computer configured as herein disclosed and described, xvii) individual or combined subroutines and programs as herein disclosed and described, xviii) the related methods disclosed and described, xix) similar, equivalent, and even implicit variations of each of these systems and methods, xx) those alternative designs which accomplish each of the functions shown as are disclosed and described, xxi) those alternative designs and methods which accomplish each of the functions shown as are implicit to accomplish that which is disclosed and described, xxii) each feature, component, and step shown as separate and independent inventions, and xxiii) the various combinations and permutations of each of the above.

With regard to claims whether now or later presented for examination, it should be understood that for practical reasons and so as to avoid great expansion of the examination burden, the applicant may at any time present only initial claims or perhaps only initial claims with only initial dependencies. Support should be understood to exist to the degree required under new matter laws—including but not limited to European Patent Convention Article 123(2) and United States Patent Law 35 U.S.C. §132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible.

Finally, any claims set forth at any time are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

We claim:

1. A method for distributing metal domes onto a surface comprising the steps of:
   providing a cartridge having at least one dispenser end;
   holding a plurality of arranged metal domes in said cartridge;
   locating said dispenser end of said cartridge and said plurality of arranged metal domes above at least one metal dome placement position;
   rotating a metal dome about a central axis to provide peripheral alignment between said metal dome and the edges of an angularly offset profile surface;
   releasing one metal dome from said dispenser end of said cartridge onto said at least one metal dome placement position; and
   moving said plurality of arranged metal domes towards said dispenser end of said cartridge in preparation for a next dispensing step.

2. The method for distributing metal domes onto a surface according to claim 1 wherein said step of releasing said one metal dome from said dispenser end of said cartridge onto said at least one metal dome placement position comprises the step of providing a metal dome placement position selected from a group consisting of an electronic device surface, a non-electronic device surface, a printed circuit board, a circuit board, a flexible circuit, a membrane switch, a rotary switch, a tact switch, a keyboard, a keypad, polyester overlay, electroluminescence lighting panel and shielding layers.

3. The method for distributing metal domes onto a surface according to claim 1 wherein said step of releasing said one metal dome from said dispenser end of said cartridge onto said at least one metal dome placement position comprises the step of dropping said one metal dome from said dispenser end of said cartridge onto said at least one metal dome placement position.

4. The method for distributing metal domes onto a surface according to claim 1 and further comprising the step of separating said one metal dome from said plurality of arranged metal domes prior to said step of releasing said one metal dome onto said at least one metal dome placement position.

5. The method for distributing metal domes onto a surface according to claim 1 wherein said step of releasing said one metal dome from said dispenser end of said cartridge onto said at least one metal dome placement position comprises the step of unidirectionally dispensing said at least one metal dome from said dispenser end of said cartridge onto said at least one metal dome placement position.

6. The method for distributing metal domes onto a surface according to claim 1 wherein said step of moving said plurality of arranged metal domes towards said dispenser end of said cartridge in preparation for said next dispensing step comprises the step of moving said plurality of arranged metal domes towards said dispenser end with a spring mechanism.

7. The method for distributing metal domes onto a surface according to claim 1 and further comprising the step of testing said metal dome after it has been released onto said placement position.

8. The method for distributing metal domes onto a surface according to claim 1 and further comprising the step of attaching a dispenser element to said dispenser end of said cartridge.

9. The method for distributing metal domes onto a surface according to claim 8 wherein said step of attaching said dispenser element to said dispenser end of said cartridge comprises the step of removably interlocking said dispenser element to said dispenser end of said cartridge.

10. The method for distributing metal domes onto a surface according to claim 8 and further comprising the step of holding said plurality of arranged metal domes in said cartridge with at least part of said dispenser element.

11. The method for distributing metal domes onto a surface according to claim 10 wherein said step of holding said plurality of arranged metal domes in said cartridge with at least part of said dispenser element comprises the step of holding said plurality of arranged metal domes in said cartridge with at least one projection.

12. The method for distributing metal domes onto a surface according to claim 10 wherein said step of holding said plurality of arranged metal domes in said cartridge with at least part of said dispenser element comprises the step of holding said plurality of arranged metal domes in said cartridge with a matched offset profile surface.

13. The method for distributing metal domes onto a surface according to claim 8 and further comprising the step of placing said cartridge having metal domes arranged in a position selected from a group consisting of face up, face down, and a combination of these.

14. The method for distributing metal domes onto a surface according to claim 1 wherein said step of locating said dispenser end of said cartridge and said plurality of arranged metal domes above at least one metal dome placement position comprises the step of manually moving said dispenser end and said plurality of arranged metal domes above said at least one metal dome placement position.

15. The method for distributing metal domes onto a surface according to claim 1 wherein said step of releasing one metal dome from said dispenser end of said cartridge onto said at least one metal dome placement position comprises the step of manually releasing said one metal dome from said dispenser end of said cartridge onto said at least one metal dome placement position.

16. The method for distributing metal domes onto a surface according to claim 15 wherein said step of manually releasing said one metal dome from said dispenser end of said cartridge onto said at least one metal dome placement position comprises the step of manually engaging a trigger.

17. The method for distributing metal domes onto a surface according to claim 16 wherein said step of manually engaging said trigger comprises the step of applying force to a button.

18. The method for distributing metal domes onto a surface according to claim 16 wherein said step of manually engaging said trigger comprises the step of engaging a metal dome rotation mechanism.

19. The method for distributing metal domes onto a surface according to claim 1 and further comprising the step of engaging a metal dome rotation mechanism.

20. The method for distributing metal domes onto a surface according to claim 18 wherein said step of engaging said metal dome rotation mechanism comprises the steps of:
  moving a ring link attached to said trigger;
  moving a ring responsive to said ring link;
  moving a rotation plate attached to an inside of said ring; and
  rotating a last metal dome with said rotation plate.

21. The method for distributing metal domes onto a surface according to claim 19 wherein said step of engaging a metal dome rotation mechanism comprises the steps of:
  moving a ring link attached to a trigger;
  moving a ring responsive to said ring link;
  moving a rotation plate attached to an inside of said ring; and
  rotating a last metal dome with said rotation plate.

22. The method for distributing metal domes onto a surface according to claim 1 and further comprising the step of rotating said one metal dome before releasing said one metal dome from said dispenser end.

23. The method for distributing metal domes onto a surface according to claim 22 wherein said step of rotating said one metal dome comprises the step of rotating said one metal dome to avoid at least one projection.

24. The method for distributing metal domes onto a surface according to claim 8 and further comprising the steps of:
  providing matched offset dome profile surfaces in said dispenser element;
  moving a last metal dome into a first profile surface;
  holding said last metal dome in said dispenser element with a second offset profile surface; and
  rotating said last dome clear of said second offset profile surface.

25. The method for distributing metal domes onto a surface according to claim 20 wherein said step of rotating said last metal dome with said rotation plate comprises the step of rotating said last metal dome with a thin blade.

26. The method for distributing metal domes onto a surface according to claim 24 wherein said step of rotating said last dome clear of said second offset profile surface comprises the step of rotating said last dome clear of said second offset profile surface with a thin blade.

27. The method for distributing metal domes onto a surface according to claim 25 wherein said thin blade comprises a blade thickness less than or equal to a metal dome thickness.

28. The method for distributing metal domes onto a surface according to claim 20 and further comprising the step of guiding said last metal dome as it drops onto said metal dome placement position.

29. The method for distributing metal domes onto a surface according to claim 24 and further comprising the step of guiding said last metal dome as it drops out of said dispenser element onto said metal dome placement position.

30. The method for distributing metal domes onto a surface according to claim 16 and further comprising the step of manually disengaging said trigger.

31. The method for distributing metal domes onto a surface according to claim 18 and further comprising the step of manually disengaging said trigger.

32. The method for distributing metal domes onto a surface according to claim 31 wherein said step of manually disengaging said trigger comprises the steps of:
  release a force applied to said trigger; and
  moving said trigger back to a first position.

33. The method for distributing metal domes onto a surface according to claim 32 wherein said step of moving said trigger back to said first position comprises the step of moving said trigger back to said first position with a spring biased toward said first position.

34. The method for distributing metal domes onto a surface according to claim 31 wherein said step of manually disengaging said trigger comprises the steps of:
release said force applied to said trigger; and
moving said trigger back to a first position with a spring biased toward said first position.

35. The method for distributing metal domes onto a surface according to claim 20 and further comprising the step of disengaging said metal dome rotation mechanism.

36. The method for distributing metal domes onto a surface according to claim 21 and further comprising the step of disengaging said metal dome rotation mechanism.

37. The method for distributing metal domes onto a surface according to claim 35 wherein said step of disengaging said metal dome rotation mechanism comprises the steps of:
reversely moving said ring link attached to said trigger;
reversely moving said ring responsive to said ring link; and
reversely moving said rotation plate attached to said inside of said ring.

38. The method for distributing metal domes onto a surface according to claim 36 wherein said step of disengaging said metal dome rotation mechanism comprises the steps of:
reversely moving said ring link attached to said trigger;
reversely moving said ring responsive to said ring link; and
reversely moving said rotation plate attached to said inside of said ring.

39. The method for distributing metal domes onto a surface according to claim 1 and further comprising the steps of:
manually moving said cartridge and said plurality of arranged metal domes above another metal dome placement position;
engaging a trigger;
releasing a last metal dome; and
releasing said trigger.

40. The method for distributing metal domes onto a surface according to claim 1 and further comprising the step of replacing said cartridge.

41. The method for distributing metal domes onto a surface according to claim 40 wherein said step of replacing said cartridge comprises the step of manually replacing said cartridge.

42. The method for distributing metal domes onto a surface according to claim 1 and further comprising the step of attaching an automated dispenser element to said dispenser end of said cartridge.

43. The method for distributing metal domes onto a surface according to claim 42 and further comprising the step of holding said plurality of metal domes in said cartridge with at least part of said automated dispenser element.

44. The method for distributing metal domes onto a surface according to claim 43 wherein said step of holding said plurality of metal domes in said cartridge with at least part of said automated dispenser element comprises the step of holding said plurality of metal domes in said cartridge with at least one projection.

45. The method for distributing metal domes onto a surface according to claim 43 wherein said step of holding said plurality of metal domes in said cartridge with at least part of said automated dispenser element comprises the step of holding said plurality of metal domes in said cartridge with a matched offset profile surface.

46. The method for distributing metal domes onto a surface according to claim 42 and further comprising the step of placing said automated dispenser element into an automated housing of a robot arm.

47. The method for distributing metal domes onto a surface according to claim 42 and further comprising the step of placing said cartridge having metal domes arranged in a position selected from a group consisting of face up, face down, and a combination of these.

48. The method for distributing metal domes onto a surface according to claim 42 wherein said step of locating said dispenser end of said cartridge and said plurality of arranged metal domes above at least one metal dome placement position comprises the step of automatically moving said automated dispenser element above said at least one metal dome placement position.

49. The method for distributing metal domes onto a surface according to claim 48 wherein said step of automatically moving said automated dispenser element above said at least one metal dome placement position comprises the step of automatically moving said automated dispenser element above said at least one metal dome placement position with a robot arm.

50. The method for distributing metal domes onto a surface according to claim 1 herein said step of releasing one metal dome from said dispenser end of said cartridge onto said at least one metal dome placement position comprises the step of automatically releasing one metal dome from said dispenser end of said cartridge onto said at least one metal dome placement position.

51. The method for distributing metal domes onto a surface according to claim 50 wherein said step of automatically releasing one metal dome from said dispenser end of said cartridge onto said at least one metal dome placement position comprises the step of automatically engaging said one metal dome with a metal dome rotation mechanism.

52. The method for distributing metal domes onto a surface according to claim 51 wherein said step of auto automatically engaging said one metal dome with a metal dome rotation mechanism comprises the steps of:
automatically moving a ring;
automatically moving a rotation plate attached to an inside of said ring; and
rotating a last metal dome with said rotation plate.

53. The method for distributing metal domes onto a surface according to claim 42 and further comprising the steps of:
providing matched offset dome profile surfaces in said dispenser element;
moving a last metal dome into a first profile surface;
holding said last metal dome in said dispenser element with a second offset profile surface; and
rotating said last dome clear of said second offset profile surface.

54. The method for distributing metal domes onto a surface according to claim 53 wherein said step of rotating said last dome comprises the step of rotating said last dome with a thin blade.

55. The method for distributing metal domes onto a surface according to claim 54 wherein said thin blade comprises a blade thickness less than or equal to a metal dome thickness.

56. The method for distributing metal domes onto a surface according to claim 52 and further comprising the step of guiding said last metal dome as it drops onto said metal dome placement position.

57. The method for distributing metal domes onto a surface according to claim 51 and further comprising the step of automatically disengaging said metal dome rotation mechanism.

58. The method for distributing metal domes onto a surface according to claim 52 and further comprising the step of automatically disengaging said metal dome rotation mechanism.

59. The method for distributing metal domes onto a surface according to claim 58 wherein said step of automatically disengaging said metal dome rotation mechanism comprises the steps of:
reversely moving a ring; and
reversely moving a rotation plate attached to an inside of said ring.

60. The method for distributing metal domes onto a surface according to claim 1 wherein said plurality of arranged metal domes comprises a plurality of footed metal domes.

61. The method for distributing metal domes onto a surface according to claim 1 and further comprising the step of placing said metal domes arranged in a position selected from a group consisting of face up, face down, and a combination of these.

62. The method for distributing metal domes onto a surface according to claim 1 wherein said step of releasing one metal dome from said dispenser end of said cartridge onto said at least one metal dome placement position comprises the step of moving said one metal dome through an axially symmetric opening.

63. The method for distributing metal domes onto a surface according to claim 62 wherein said moving said one metal dome through said axially symmetric opening comprises the step providing a capability of moving said metal domes through said axially symmetric opening, wherein said metal domes are arranged in a position selected from a group consisting of face up, face down, and a combination of these.

64. The method for distributing metal domes onto a surface according to claim 1 and further comprising the step of changing an orientation of said one metal dome before dispensing.

65. The method for distributing metal domes onto a surface according to claim 64 wherein said step of changing said orientation of said one metal dome before dispensing comprises the step of manually changing said orientation of said one metal dome before dispensing.

66. The method for distributing metal domes onto a surface according to claim 64 wherein said step of changing said orientation of said one metal dome before dispensing comprises the step of automatically changing said orientation of said one metal dome before dispensing.

67. The method for distributing metal domes onto a surface according to claim 64 wherein said step of change changing said orientation of said one metal dome before dispensing comprises the step of reversing a position of a cartridge.

68. The method for distributing metal domes onto a surface according to claim 1 wherein said step of providing said cartridge having at least one dispenser end comprises the step of providing a slotted cartridge.

69. The method for distributing metal domes onto a surface according to claim 1 wherein said step of providing said cartridge comprises the step of providing a C shaped cartridge.

70. The method for distributing metal domes onto a surface according to claim 1 and further comprising the step of visually indicating an amount of metal domes in said cartridge.

71. The method for distributing metal domes onto a surface according to claim 70 wherein said step of visually indicating an amount of metal domes in said cartridge comprises the step of providing a slotted cartridge.

72. The method for distributing metal domes onto a surface according to claim 1 and further comprising the step of guiding said one metal dome when releasing onto said at least one metal dome placement position.

73. The method for distributing metal domes onto a surface according to claim 1 and further comprising the step of guiding said one metal dome through a tapered element attached at an end of said cartridge.

74. The method for distributing metal domes onto a surface according to claim 73 and further comprising an inside surface of said tapered element which matches an exterior shape of a metal dome.

75. The method for distributing metal domes onto a surface according to claim 64 wherein said step of changing an orientation of said one metal dome before dispensing comprises the step of rotationally changing an orientation of said one metal dome before dispensing.

76. The method for distributing metal domes onto a surface according to claim 75 wherein said step of rotationally changing an orientation of said one metal dome before dispensing comprises the step of planar rotation of said one metal dome about 30 degrees.

77. A method for distributing metal domes onto a surface comprising the steps of:
providing a cartridge having at least one dispenser end;
holding a plurality of arranged metal domes in said cartridge;
locating said dispenser end of said cartridge and said plurality of arranged metal domes above at least one metal dome placement position;
rotating a metal dome about a central axis to provide peripheral alignment between said metal dome and the edges of an angularly offset profile surface;
separating one metal dome from said plurality of arranged metal domes prior to dispensing said separated metal dome;
unidirectionally dispensing said separated metal dome from said plurality of arranged metal domes at said dispenser end of said cartridge onto said at least one metal dome placement position; and
moving said plurality of arranged metal domes towards said dispenser end of said cartridge in preparation for a next dispensing step.

78. The method for distributing metal domes according to claim 77 wherein said step of unidirectionally dispensing said separated metal dome from said plurality of arranged metal domes at said dispenser end of said cartridge onto said at least one metal dome placement position comprises the step of unidirectionally releasing said separated metal dome from said plurality of arranged metal domes at said dispenser end of said cartridge onto said at least one metal dome placement position.

79. The method for distributing metal domes according to claim 77 wherein said step of unidirectionally dispensing said separated metal dome from said plurality of arranged metal domes at said dispenser end of said cartridge onto said at least one metal dome placement position comprises the step of unidirectionally dropping said separated metal dome from said plurality of arranged metal domes at said dispenser end of said cartridge onto said at least one metal dome placement position.

80. The method for distributing metal domes according to claim 77 wherein said step of unidirectionally dispensing said separated metal dome from said plurality of arranged metal domes at said dispenser end of said cartridge onto said at least one metal dome placement position comprises the step of providing a metal dome placement position selected from an electronic device surface, a non-electronic device surface, a printed circuit board, a circuit board, a flexible circuit, a membrane switch, a rotary switch, a tact switch, a keyboard, a keypad, polyester overlay, electroluminescence lighting panel and shielding layers.

81. The method for distributing metal domes according to claim 77 wherein said step of wherein said step of moving said plurality of arranged metal domes towards said dispenser end of said cartridge in preparation for said next dispensing step comprises the step of moving said plurality of arranged metal domes towards said dispenser end with a spring mechanism.

82. The method for distributing metal domes according to claim 77 and further comprising the step of testing said metal dome after it has been placed onto said placement position.

83. The method for distributing metal domes according to claim 77 and further comprising the step of attaching a dispenser element to said dispenser end of said cartridge.

84. The method for distributing metal domes according to claim 83 and further comprising the step of holding said plurality of arranged metal domes in said cartridge with at least part of said dispenser element.

85. The method for distributing metal domes according to claim 84 wherein said step of holding said plurality of arranged metal domes in said cartridge with at least part of said dispenser element comprises the step of holding said plurality of arranged metal domes in said cartridge with a matched offset profile surface.

86. The method for distributing metal domes according to claim 77 wherein said step of locating said dispenser end of said cartridge and said plurality of arranged metal domes above at least one metal dome placement position comprises the step of manually moving said dispenser end and said plurality of arranged metal domes above said at least one metal dome placement position.

87. The method for distributing metal domes according to claim 77 wherein said step of unidirectionally dispensing said separated metal dome onto said at least one metal dome placement position comprises the step of manually dispensing said separated metal dome onto said at least one metal dome placement position.

88. The method for distributing metal domes according to claim 87 wherein said step of manually dispensing said separated metal dome onto said at least one metal dome placement position comprises the step of engaging a trigger.

89. The method for distributing metal domes according to claim 88 wherein said step of engaging said trigger comprises the step of engaging a metal dome rotation mechanism.

90. The method for distributing metal domes according to claim 89 wherein said step of engaging said metal dome rotation mechanism comprises the steps of:
moving a ring link attached to said trigger;
moving a ring responsive to said ring link;
moving a rotation plate attached to an inside of said ring; and
rotating a last metal dome with said rotation plate.

91. The method for distributing metal domes according to claim 77 wherein said step of separating said one metal dome from said plurality of arranged metal domes comprises the step of rotating said one metal dome.

92. The method for distributing metal domes according to claim 83 and further comprising the steps of:
providing matched offset dome profile surfaces in said dispenser element;
moving a last metal dome into a first profile surface;
holding said last metal dome in said dispenser element with a second offset profile surface; and
rotating said last dome clear of said second offset profile surface.

93. The method for distributing metal domes according to claim 90 and further comprising the step of disengaging said metal dome rotation mechanism.

94. The method for distributing metal domes according to claim 93 wherein said step of disengaging said metal dome rotation mechanism comprises the steps of:
reversely moving said ring link attached to said trigger;
reversely moving said ring responsive to said ring link; and
reversely moving said rotation plate attached to said inside of said ring.

95. The method for distributing metal domes according to claim 77 and further comprising the steps of:
manually moving said cartridge and said plurality of arranged metal domes above another metal dome placement position;
engaging a trigger;
unidirectionally dispensing a last metal dome; and
releasing said trigger.

96. The method for distributing metal domes according to claim 77 and further comprising the step of attaching an automated dispenser element to said dispenser end of said cartridge.

97. The method for distributing metal domes according to claim 96 and further comprising the step of placing said automated dispenser element into an automated housing of a robot arm.

98. The method for distributing metal domes according to claim 96 wherein said step of locating said dispenser end of said cartridge and said plurality of arranged metal domes above at least one metal dome placement position comprises the step of automatically moving said automated dispenser element above said at least on metal dome placement position.

99. The method for distributing metal domes according to claim 77 wherein said step of unidirectionally dispensing said separated metal dome comprises the step of automatically unidirectionally dispensing said separated metal dome.

100. The method for distributing metal domes according to claim 99 wherein said step of automatically unidirectionally dispensing said separated metal dome comprises the step of automatically engaging said one metal dome with a metal dome rotation mechanism.

101. The method for distributing metal domes according to claim 100 wherein said step of automatically engaging said one metal dome with a metal dome rotation mechanism comprises the steps of:
automatically moving a ring;
automatically moving a rotation plate attached to an inside of said ring; and
rotating a last metal dome with said rotation plate.

102. The method for distributing metal domes according to claim 96 and further comprising the steps of:
providing matched offset dome profile surfaces in said dispenser element;
moving a last metal dome into a first profile surface;
holding said last metal dome in said dispenser element with a second offset profile surface; and
rotating said last dome clear of said second offset profile surface.

103. The method for distributing metal domes according to claim 101 and further comprising the step of guiding said last metal dome as it drops onto said metal dome placement position.

104. The method for distributing metal domes according to claim 100 and further comprising the step of automatically disengaging said metal dome rotation mechanism.

105. The method for distributing metal domes according to claim 104 wherein said step of automatically disengaging said metal dome rotation mechanism comprises the steps of:
   reversely moving a ring; and
   reversely moving a rotation plate attached to an inside of said ring.

106. The method for distributing metal domes according to claim 77 wherein said step of unidirectionally dispensing said separated metal dome from said dispenser end of said cartridge onto said at least one metal dome placement position comprises the step of moving said one metal dome through an axially symmetric opening.

107. The method for distributing metal domes according to claim 77 wherein said step of providing said cartridge having at least one dispenser end comprises the step of providing a slotted cartridge.

108. The method for distributing metal domes according to claim 107 wherein said step of providing said cartridge comprises the step of providing a c-shaped cartridge.

109. The method for distributing metal domes according to claim 77 and further comprising the step of visually indicating an amount of metal domes in said cartridge.

110. The method for distributing metal domes according to claim 77 and further comprising the step of guiding said one metal dome when releasing onto said at least one metal dome placement position.

* * * * *